United States Patent
Oikawa et al.

(10) Patent No.: US 11,381,250 B2
(45) Date of Patent: Jul. 5, 2022

(54) DECODE DEVICE

(71) Applicant: Kioxia Corporation, Tokyo (JP)

(72) Inventors: Kohei Oikawa, Kawasaki (JP); Masato Sumiyoshi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 17/015,874

(22) Filed: Sep. 9, 2020

(65) Prior Publication Data

US 2021/0250043 A1 Aug. 12, 2021

(30) Foreign Application Priority Data

Feb. 10, 2020 (JP) .............................. JP2020-020789

(51) Int. Cl.
*H03M 7/42* (2006.01)
*G06F 3/06* (2006.01)

(52) U.S. Cl.
CPC .......... *H03M 7/425* (2013.01); *G06F 3/0604* (2013.01); *G06F 3/0659* (2013.01); *G06F 3/0679* (2013.01)

(58) Field of Classification Search
CPC .... H03M 7/70; H03M 7/3082; H03M 7/3059; H03M 7/425; G06F 3/0604; G06F 3/0659; G06F 3/0679
USPC ..................................................... 341/50–90
See application file for complete search history.

(56) References Cited

U.S. PATENT DOCUMENTS

| | | | |
|---|---|---|---|
| 1,119,702 A * | 12/1914 | Infeld ..................... | G11B 15/68 211/74 |
| 5,363,097 A | 11/1994 | Jan | |
| 5,668,548 A | 9/1997 | Bakhmutsky | |
| 5,757,295 A | 5/1998 | Bakhmutsky | |
| 8,804,852 B2 | 8/2014 | Agarwal et al. | |
| 8,867,614 B2 | 10/2014 | Shiodera et al. | |
| 9,100,042 B2 | 8/2015 | Martin | |
| 2013/0148745 A1 | 6/2013 | Agarwal et al. | |
| 2016/0112064 A1* | 4/2016 | Dalton .................. | G06F 3/0608 341/106 |
| 2019/0348997 A1* | 11/2019 | Lee ...................... | H03M 7/3066 |
| 2020/0228137 A1* | 7/2020 | Chinya ............... | H03M 7/3082 |
| 2020/0373941 A1* | 11/2020 | Latorre .................... | G06N 3/08 |

(Continued)

FOREIGN PATENT DOCUMENTS

| | | |
|---|---|---|
| JP | 5492206 B2 | 5/2014 |
| JP | 5742464 B2 | 7/2015 |
| JP | 5878644 B2 | 3/2016 |

*Primary Examiner* — Lam T Mai

(74) *Attorney, Agent, or Firm* — Oblon, McClelland, Maier & Neustadt, L.L.P.

(57) ABSTRACT

According to one embodiment, a dividing circuit divides a first bit string into second bit strings and outputs the divided second bit strings. The dividing circuit includes first, second, and third blocks. The first block executes first operation for each bit of a third bit string in the first bit string. The first operation is to calculate a head bit of a succeeding symbol when one bit is assumed to be a head of one symbol. The second block executes second operation for each bit of the third bit string for a set number of times. The second operation is to overwrite boundary information associated with one bit with boundary information associated with a bit indicated by the boundary information. The third block divides the third bit string immediately before a second bit indicated by boundary information associated with a first bit of the third bit string.

20 Claims, 18 Drawing Sheets

(56) References Cited

U.S. PATENT DOCUMENTS

2021/0174259 A1\* 6/2021 Miao ..................... H03M 7/702
2021/0294525 A1\* 9/2021 Sumiyoshi .......... H03M 7/6005

\* cited by examiner

DECODE DEVICE

CROSS-REFERENCE TO RELATED APPLICATIONS

This application is based upon and claims the benefit of priority from Japanese Patent Application No. 2020-020789, filed on Feb. 10, 2020; the entire contents of which are incorporated herein by reference.

FIELD

Embodiments described herein relate generally to a decode device.

BACKGROUND

There has been known a decode device configured to divide a bit string composed of variable length symbols into a plurality of bit strings and to decode the plurality of divided bit strings generated in parallel. However, the processing time for dividing a bit string becomes a bottleneck, and thus makes it difficult to improve the throughput of the decode device.

DETAILED DESCRIPTION

In general, according to one embodiment, a decode device includes a dividing circuit and a first decode circuit. The dividing circuit divides a first bit string including variable length symbols into a plurality of second bit strings and outputs the divided second bit strings. The first decode circuit decodes the plurality of second bit strings. The dividing circuit includes a first block, a second block, and a third block. The first block acquires a third bit string which is a part of the first bit string and executes first operation for each bit of at least a part of the third bit string. The first operation is to calculate a head bit of a symbol succeeding one symbol by assuming one bit to be a head of the one symbol and to record the head bit as boundary information associated with the one bit. The second block executes second operation for each bit of at least a part of the third bit string for a set number of times. The second operation is to overwrite boundary information associated with one bit with boundary information associated with a bit indicated by the boundary information associated with the one bit. The third block outputs a fourth bit string obtained by dividing the third bit string immediately before a second bit indicated by boundary information associated with a first bit of the third bit string as one of the plurality of second bit strings.

The decode device according to the embodiment can be mounted on various systems. In the following, a case where the decode device is mounted on a memory system will be described. Note that even when the decode device is mounted on a system other than the memory system, the same explanation is applicable to the decode device.

The decode device according to the embodiment will be explained below in detail with reference to the accompanying drawings. Note that the present invention is not limited to these embodiments.

First Embodiment

Figure 1:
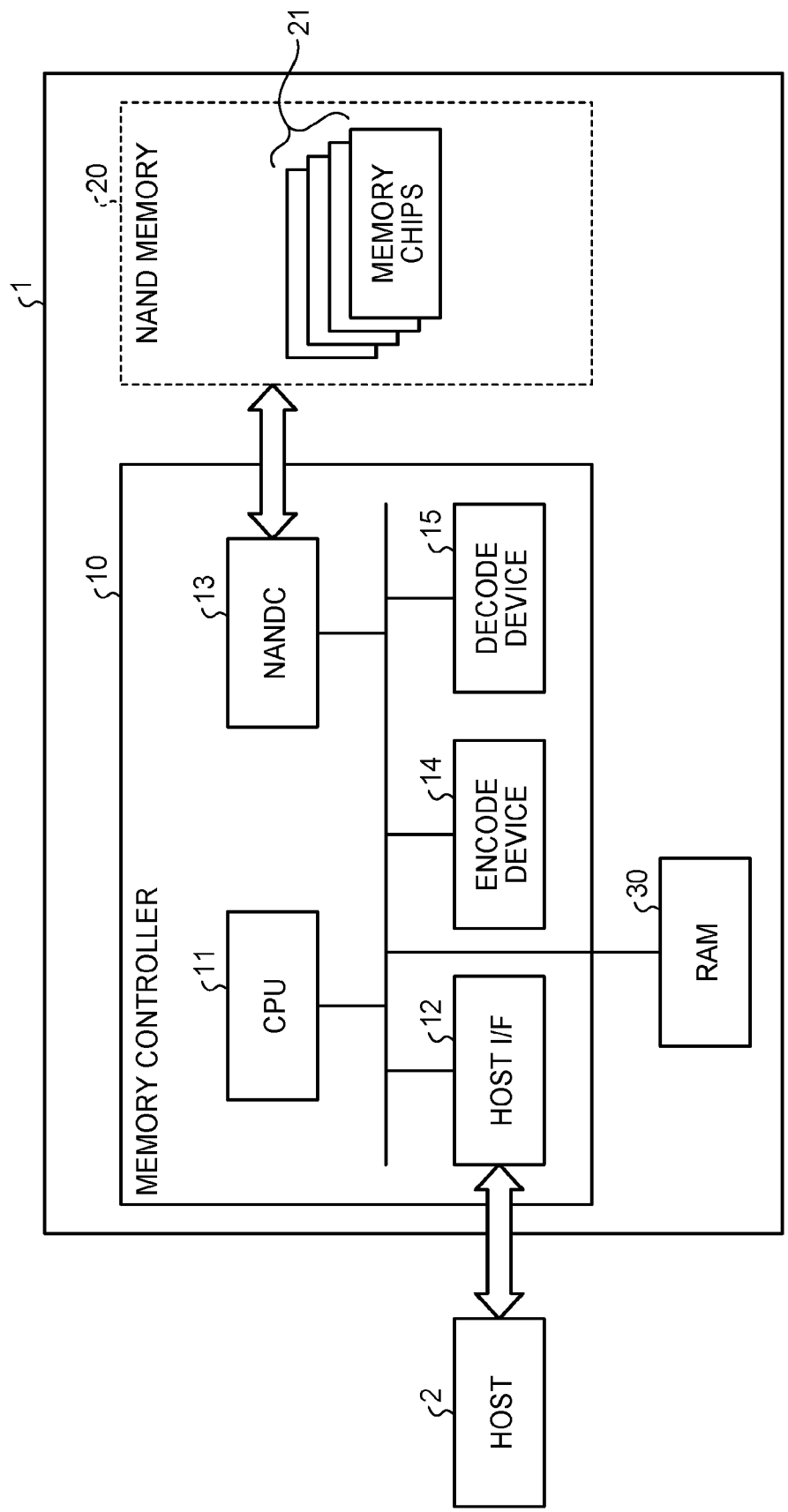
FIG. 1 is a schematic diagram illustrating an example of the configuration of a memory system including a decode device according to a first embodiment.

FIG. 1 is a schematic diagram illustrating an example of the configuration of a memory system 1 including a decode device according to a first embodiment. As illustrated in FIG. 1, the memory system 1 is connected to a host 2 through a predetermined communication interface. The host 2 may be, for example, a personal computer, a personal digital assistant, or a server. The memory system 1 can receive various requests from the host 2.

The memory system 1 includes a memory controller 10, a NAND flash memory (NAND memory) 20, and a random access memory (RAM) 30.

The NAND memory 20 is a nonvolatile storage device that functions as storage. The NAND memory 20 may be configured by one or more memory chips 21.

The RAM 30 is used by the memory controller 10 as a buffer for data transfer, a cache for various kinds of management information, for example.

The memory controller 10 executes various operation including data transfer between the host 2 and the NAND memory 20. Therefore, the memory controller 10 includes a central processing unit (CPU) 11, a host interface (I/F) 12, a NAND controller (NANDC) 13, an encode device 14, and a decode device 15.

The CPU 11 realizes the control of the whole memory controller 10 based on the firmware program. The NANDC 13 transmits a command for performing access (writing data, reading data, and erasing data) to the NAND memory 20 to the target memory chip 21 based on an instruction from the CPU 11, and transmits and receives data corresponding to the command to and from the memory chip 21. The host I/F 13 transmits and receives information such as data and requests to and from the host 2.

The encode device 14 performs variable length encoding on the data received from the host 2. The data received from the host 2 is converted into a column of symbols of variable length by variable length encoding and then written into the NAND memory 20.

Note that the method of variable length encoding is not limited to a specific method. The variable length encoding may be, for example, Huffman encoding.

The data received from the host 2 may also be subjected to arbitrary processing in addition to variable length encoding and then written into the NAND memory 20.

The decode device 15 decodes the variable length encoded data read from the NAND memory 20. Thus, the variable length encoded data is converted into the original data.

The memory controller 10 may be configured as a system-on-a-chip (SoC). The memory controller 10 may be configured by a plurality of chips. The RAM 30 may also be included in the memory controller 10. The memory controller 10 may also include a field-programmable gate array (FPGA) or an application specific integrated circuit (ASIC) in addition to the CPU 11 or in place of the CPU 11.

Figure 2:
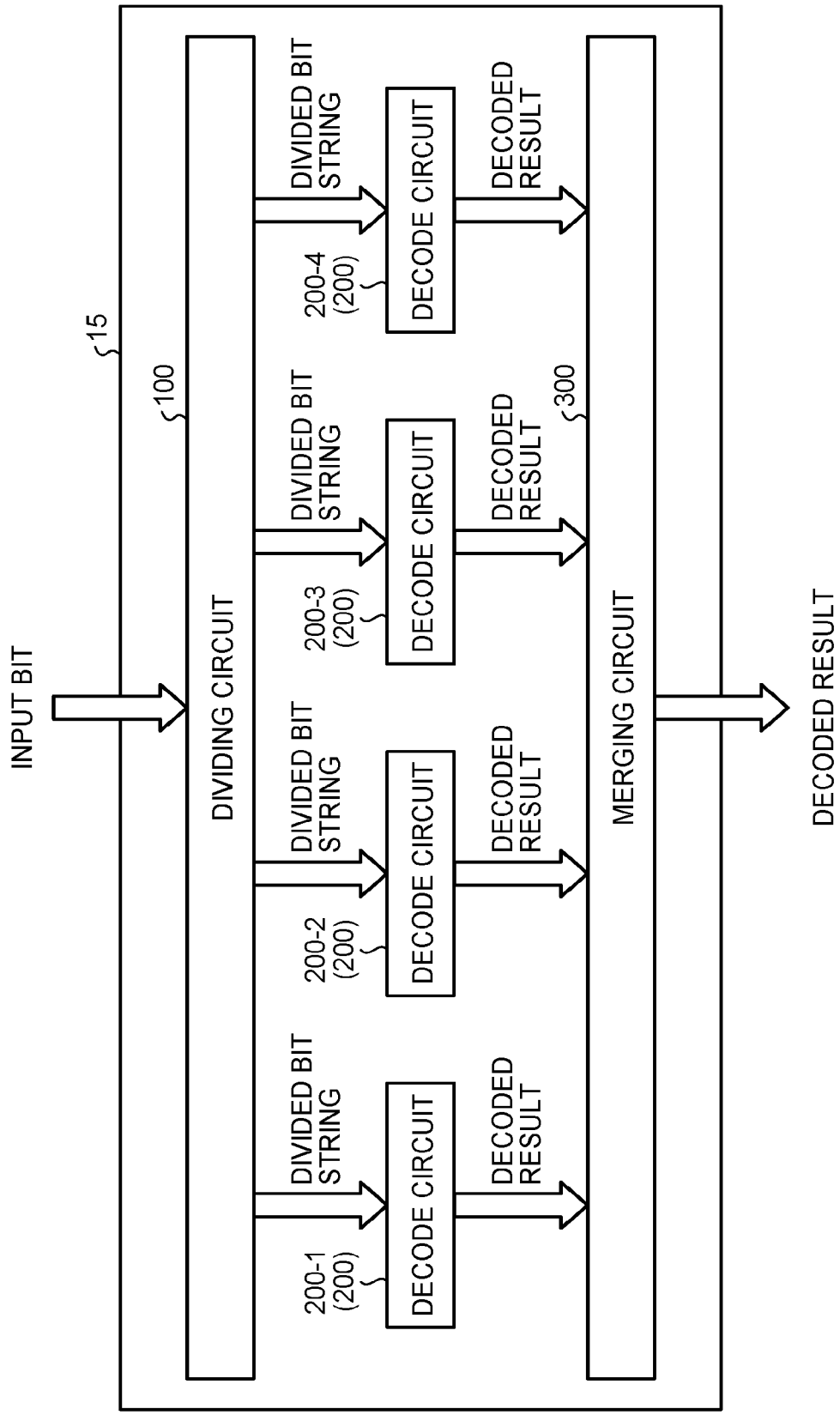
FIG. 2 is a schematic diagram illustrating an example of the configuration of the decode device according to the first embodiment.

FIG. 2 is a schematic diagram illustrating an example of the configuration of the decode device 15 according to the first embodiment. As illustrated in the figure, the decode device 15 includes a dividing circuit 100, a plurality of decode circuits 200, and a merging circuit 300. Here, as an example, four decode circuits 200-1, 200-2, 200-3, and 200-4 are provided in the decode device 15 as a plurality of decode circuits 200. Note that the number of decode circuits 200 is not limited to four.

Each of the decode circuits 200 corresponds to a second decode circuit. Further, a combination of the plurality of second decode circuits can be regarded as a first decode circuit.

The dividing circuit 100 receives an input of a bit string which is variable length encoded data read from the NAND memory 20. The dividing circuit 100 then divides the input bit string into a plurality of symbols, and distributes the divided bit strings to the four decode circuits 200.

The four decode circuits 200 can operate in parallel. The four decode circuits 200 decode the respective divided bit strings inputted from the dividing circuit 100 in parallel.

The merging circuit 300 merges outputs of the four decode circuits 200 and outputs the data obtained by the merge as decoded data.

Figure 3:
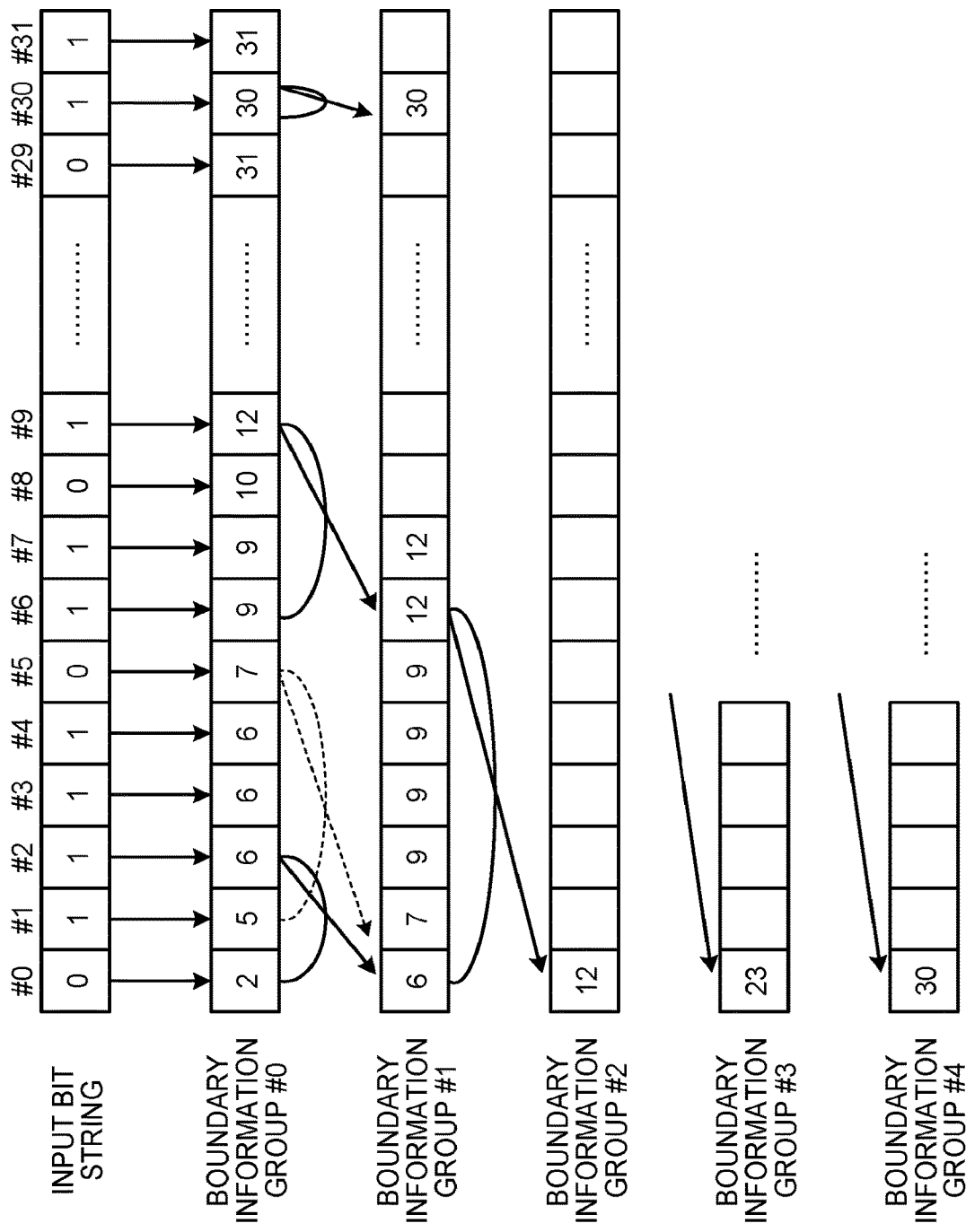
FIG. 3 is a schematic diagram for describing the operation of a dividing circuit according to the first embodiment.

FIG. 3 is a schematic diagram for describing the operation of the dividing circuit 100 according to the first embodiment. In the example of the figure, a case where a bit string of 32-bit length is received by the dividing circuit 100 will be described.

The dividing circuit 100 first calculates boundary information (hereinafter referred to as first operation) for each bit of the input bit string. In the first operation, decoding only one symbol of a bit string whose head bit is a targeted bit (target bit) allows the position of a head bit of a succeeding symbol, when the targeted bit is assumed to be a head bit of the one symbol, to be calculated as boundary information. The first operation is executed in parallel to all the bits of the input bit string.

For example, six kinds of symbols "00", "01", "10", "110", "1110", and "1111" are assumed to be defined. When attention is paid to a bit #0 of the input bit string in FIG. 3, since the input bit string follows "01111 . . . " in order from the bit #0, only "01" of the six kinds of symbols can have the bit #0 as the head bit. Therefore, the boundary information related to the bit #0 is obtained as a bit #2, which is the bit two bits after the bit #0.

When attention is paid to a bit #1 of the input bit string, since the input bit string follows "11110" in order from the bit #1, only "1111" of the six kinds of symbols can have the bit #1 as the head bit. Therefore, the boundary information related to the bit #1 is obtained as a bit #5, which is the bit four bits after the bit #1.

When attention is paid to a bit #2 of the input bit string, since the input bit string follows "11101" in order from the bit #2, only "1110" of the six kinds of symbols can have the bit #2 as the head bit. Therefore, the boundary information related to the bit #2 is obtained as a bit #6, which is the bit four bits after the bit #2.

Note that in the case where attention is paid to a bit near the end of the input bit string, if there is no symbol that can have a targeted bit as a head bit, the dividing circuit 100 stores the position of a targeted bit itself in association with a targeted bit.

For example, when attention is paid to a bit #30 of the input bit string in FIG. 3, the input bit string becomes "11" in order from the bit #30. However, "11" does not correspond to any of the six kinds of symbols. Therefore, as the boundary information related to the bit #30, its own position, that is, the bit #30 is set.

The dividing circuit 100, when calculating boundary information related to a targeted bit, stores the boundary information in association with the targeted bit. The boundary information thus calculated for each bit is stored as a boundary information group #0. In the following, the boundary information associated with a bit #m may be referred to as boundary information of the bit #m.

The dividing circuit 100 subsequently updates boundary information (hereinafter referred to as second operation) for each bit of the input bit string. In the second operation, the boundary information (referred to as first boundary information) of a targeted bit is overwritten with the boundary information (referred to as second boundary information) of the bit indicated by the first boundary information. The second operation is executed in parallel to all the bits of the input bit string.

For example, in the boundary information group #0 in FIG. 3, the boundary information of the bit #0 is "2", and the boundary information of the bit #2, which is a bit indicated by the boundary information "2", is "6". Therefore, the boundary information of the bit #0 is updated from "2" to "6".

In the boundary information group #0, the boundary information of the bit #1 is "5", and the boundary information of the bit #5, which is a bit indicated by the boundary information "5", is "7". Therefore, the boundary information of the bit #1 is updated from "5" to "7".

In the boundary information group #0, the boundary information of the bit #2 is "6", and the boundary information of the bit #6, which is indicated by the boundary information "6", is "9". Therefore, the boundary information of the bit #2 is updated from "6" to "9".

The second operation for all the bits is executed for the set number of times. The group of boundary information after the second operation of n times (where n is an integer equal to or greater than one and equal to or less than the set number) is executed is referred to as a boundary information group #n.

While the second operation for each bit is repeated, no boundary information is changed by the second operation. The number of the second operation that can be guaranteed that no boundary information is changed is set. A state in which no boundary information is changed is referred to as a steady state.

When the first operation for all the bits is executed n times, the boundary position of the 2^n symbols ahead is associated with each bit. In the example of FIG. 3, the input bit string has a length of 32 bits and may include at most 16 symbols. Therefore, if the second operation is executed for all the bits four times, the boundary information group can be brought into a steady state. In other words, in the example of FIG. 3, "4" is sufficient. Hereinafter, "4" is assumed to be the set number.

When the boundary information group is in the steady state, the bit corresponding to the correct symbol boundary, that is, the head bit of the correct symbol, is associated with boundary information indicating the symbol boundary positioned on the rearmost side among a plurality of symbol boundaries included in the input bit string.

In other words, for example, when the head bit of the input bit string is a correct symbol boundary, the boundary information associated with the head bit of the input bit string indicates a symbol boundary positioned on the rearmost side among a plurality of symbol boundaries included in the input bit string.

According to the example illustrated in FIG. 3, the boundary information of bit "0" indicates the bit #30. Therefore, the symbol boundary positioned on the rearmost side can be between the bit #29 and the bit #30.

The dividing circuit 100 divides the bit string at the symbol boundary positioned on the rearmost side of the input bit string specified as described above.

The technique compared with the first embodiment will now be described. The technique is referred to as a comparative example. According to the comparative example, a symbol boundary positioned on the rearmost side of an input bit string of 32-bit length is specified by sequentially decoding the head symbol of the input bit string of 32-bit length. However, according to the comparative example, since a symbol boundary positioned on the rearmost side is specified after decoding up to 16 symbols, a large amount of time is required for one dividing operation. Therefore, the dividing operation becomes a bottleneck, and the throughput of the decode device reaches a peak.

On the other hand, according to the first embodiment, a desired symbol boundary can be specified by completing the first operation for all the bits with a time corresponding to one decode and then executing the second operation for all the bits four times. Therefore, the time required for one dividing operation can be significantly reduced as compared with the comparative example. Thus, the throughput of the decode device 15 can be improved as compared with the comparative example.

The operation for the bit string (hereinafter referred to as a remaining bit string) left over by the division is optional. In the first embodiment, as an example, the remaining bit string is used as a bit string of the head portion of the next input bit string. Thus, the head bit of the input bit string can always be regarded as a correct symbol boundary.

Figure 4:
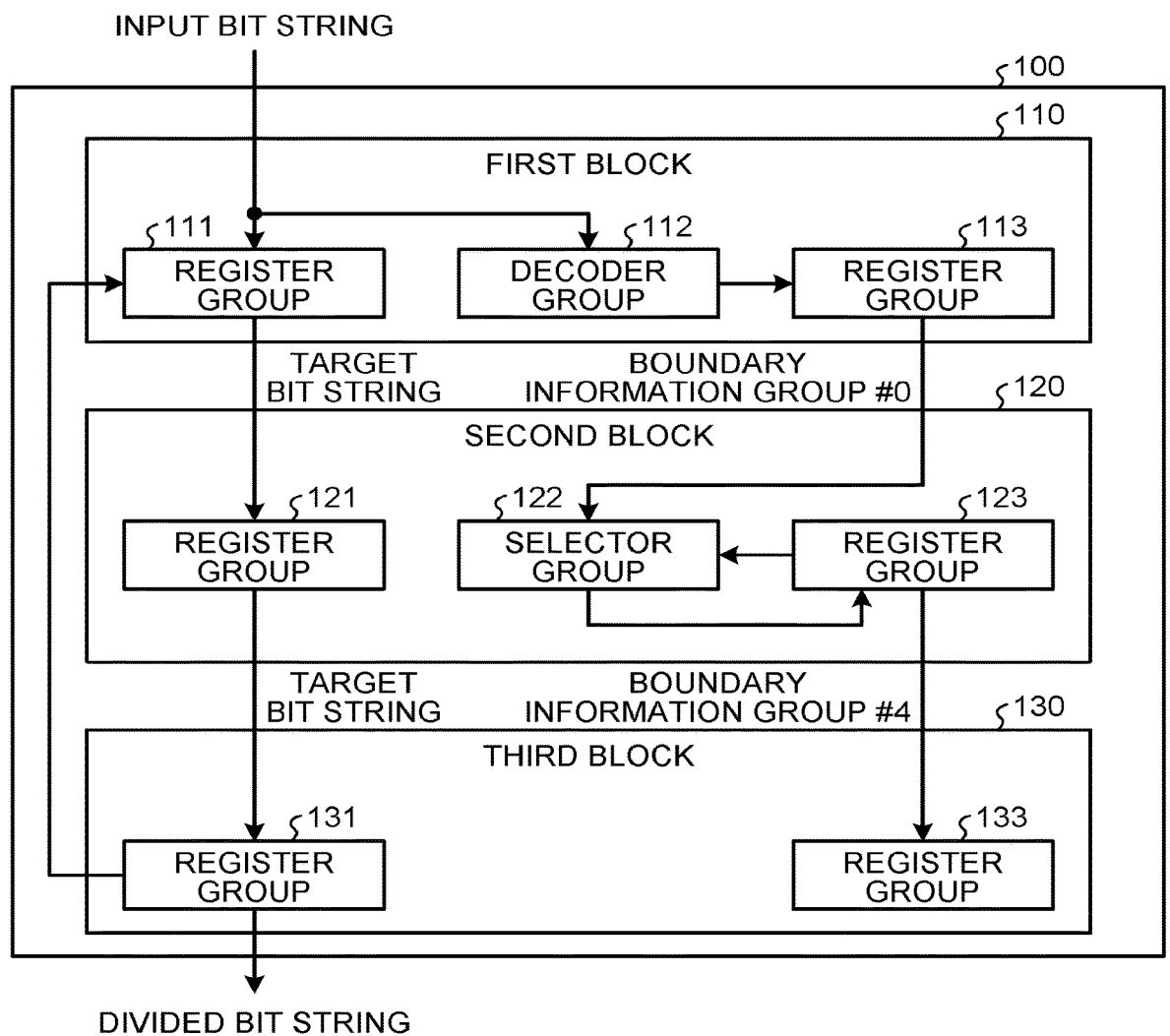
FIG. 4 is a schematic diagram illustrating an example of the configuration of the dividing circuit according to the first embodiment.

FIG. 4 is a schematic diagram illustrating an example of the configuration of the dividing circuit 100 according to the first embodiment. As illustrated in the figure, the dividing circuit 100 includes a first block 110, a second block 120, and a third block 130.

The first block 110 is a circuit block that receives a new bit string and executes first operation. Specifically, the first block 110 includes a register group 111, a decoder group 112, and a register group 113. The register group 111 stores an input bit string. The decoder group 112 is a group of decoders provided for each bit of an input bit string, and each decoder of the decoder group 112 executes the first operation in parallel. The register group 113 stores the boundary information group #0 obtained by the decoder group 112.

When a remaining bit string is generated in the previous dividing operation, the first block 110 receives the remaining bit string in the head part of the register group 111 and receives a new bit string in the remaining part of the register group 111. The bit string of a set length thus stored in the register group 111 is referred to as a target bit string. According to the example of FIG. 3, the target bit string has a length of 32 bits.

The second block 120 is a circuit block that executes the second operation for all the bits of the target bit string for a set number of times (specifically in this example, four times). Specifically, the second block 120 includes a register group 121, a selector group 122, and a register group 123.

The register group 121 receives the target bit string from the register group 111 of the first block 110. The selector group 122 is a group of selectors provided for each bit of the target bit string, and each selector of the selector group 122 executes the second operation in parallel. The selector group 122 executes the second operation for each bit to the boundary information group stored in the register group 123, and stores the execution result of the second operation for each bit in the register group 123 in an overwriting form.

The selector group 122 executes the second operation to all the bits of the target bit string for the set number of times (i.e., four times). In the first execution, the selector group 122 acquires the boundary information group from the register group 113 of the first block 110. In the second and subsequent executions, the selector group 122 acquires the boundary information group from the register group 123. When the second operation of four times is completed, a boundary information group #4 is stored in the register group 123.

The third block 130 is a circuit block for dividing the target bit string and outputting the divided bit string. Specifically, the third block 130 includes a register group 131 for receiving the target bit string from the register group 121 of the second block 120, and a register group 133 for receiving the boundary information group #4 from the register group 123 of the second block 120. The third block 130 specifies the division position based on the boundary information group #4 received by the register group 133, and divides the target bit string received by the register group 131 at the specified division position.

Figure 5:
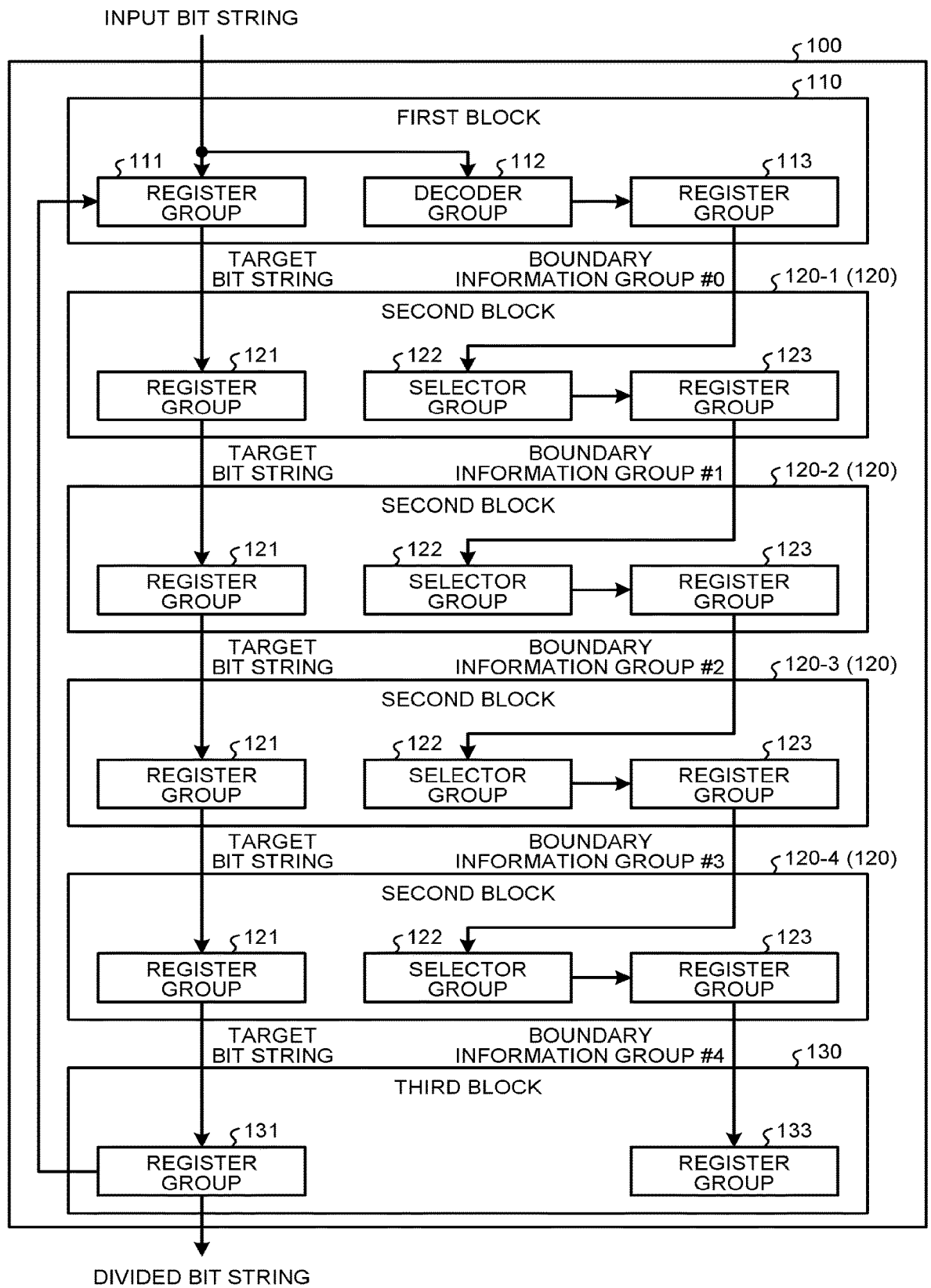
FIG. 5 is a schematic diagram illustrating another example of the configuration of the dividing circuit according to the first embodiment.

FIG. 5 is a schematic diagram illustrating another example of the configuration of the dividing circuit 100 according to the first embodiment. As illustrated in the figure, the dividing circuit 100 includes a first block 110, second blocks 120-1, 120-2, 120-3, and 120-4 having the number of blocks equal to the set number (specifically four), and a third block 130.

The configuration of the first block 110 is the same as that of the first block 110 in FIG. 4.

The four second blocks 120-1, 120-2, 120-3, and 120-4 are connected in series. Further, the four second blocks 120-1, 120-2, 120-3, and 120-4 have identical configurations. The four second blocks 120-1, 120-2, 120-3, and 120-4 are collectively referred to as a second block 120.

Each of the second blocks 120 includes a register group 121, a selector group 122, and a register group 123.

The register group 121 receives the target bit string from the preceding circuit block. The selector group 122 receives the boundary information group from the preceding circuit block and executes second operation for each bit of the target bit string. The selector group 122 then stores the execution result of the second operation for each bit in the register group 123.

In the example of FIG. 5, in each of the second blocks 120, the second operation for all the bits of the target bit string is executed only once. In the dividing circuit 100, the four second blocks 120 are connected in series. Therefore, the second block 120-4 provided on the last block among the four second blocks 120 can output the boundary information group #4.

The third block 130 has the same configuration as the third block 130 in FIG. 4.

As described above, the example illustrated in FIG. 5 differs from the example illustrated in FIG. 4 in that each of the second blocks 120 executes the second operation for all the bits only once. As illustrated in FIG. 4, one second block 120 may be configured to execute the second operation for all the bits for a set number of times, or as illustrated in FIG. 5, each of the second blocks 120 may be configured to execute the second operation for all the bits only once and send the execution result to a subsequent circuit block. Each of the second blocks 120 may also be configured to execute the second operation for all the bits twice or more and less than the set number of times and send the execution result to a subsequent circuit block.

Figure 6:
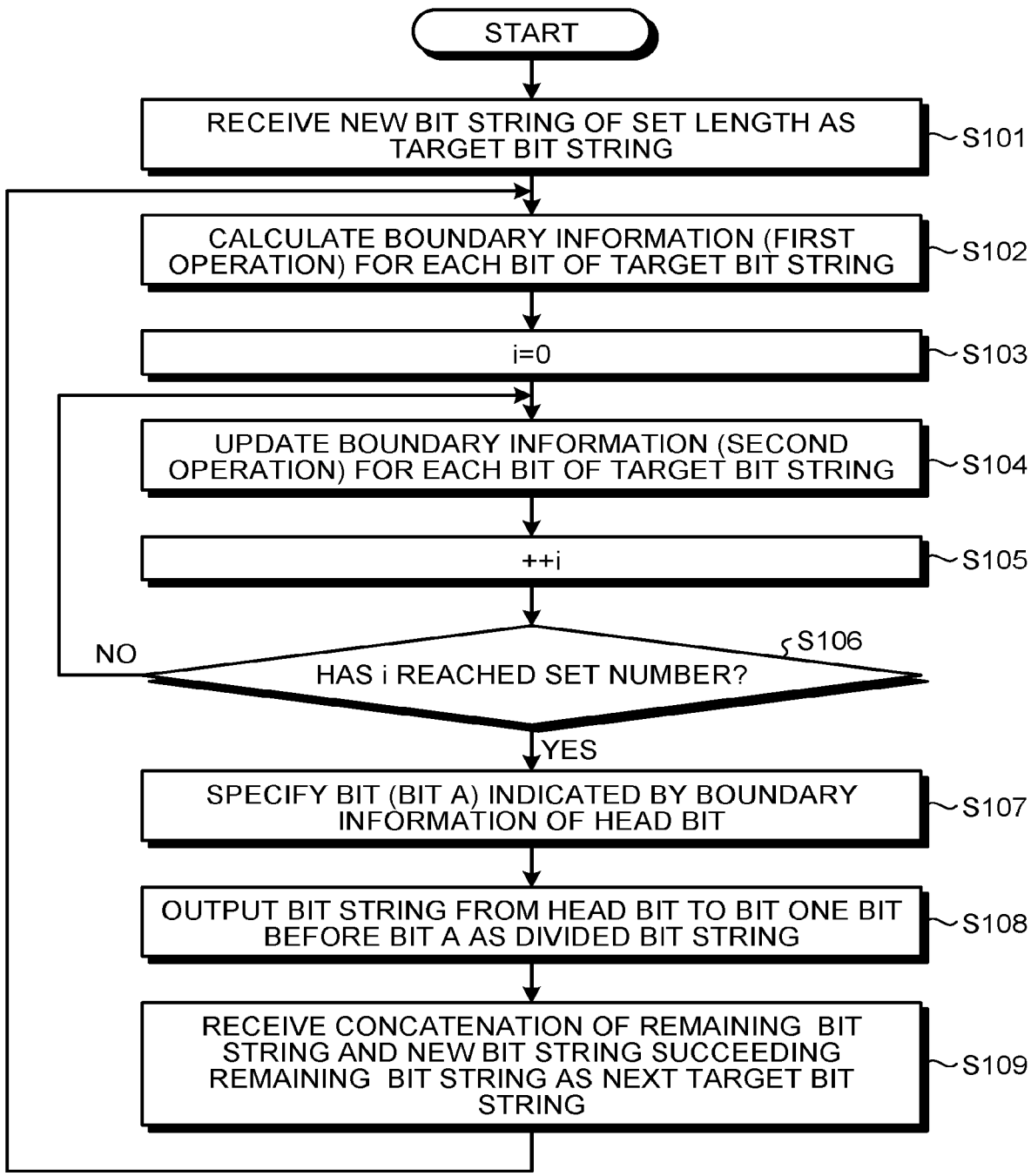
FIG. 6 is a flowchart for describing an example of the operation of the dividing circuit according to the first embodiment.

FIG. 6 is a flowchart for describing an example of the operation of the dividing circuit 100 according to the first embodiment.

The first block 110 first receives a new bit string of a set length as a target bit string in the register group 111 (S101). The decoder group 112 of the first block 110 subsequently calculates boundary information (first operation) for each bit of the target bit string (S102).

A loop counter i for executing second operation for all the bits for a set number of times is then reset to (S103).

In the configuration of FIG. 4, the loop counter i can be held in the second block 120. In the configuration of FIG. 5, the second blocks 120 having the number of blocks equal to the set number sequentially execute the second operation one by one, and thus the loop counter i may be omitted.

After the S103, the selector group 122 of the second block 120 updates boundary information (second operation) for each bit of the target bit string (S104). After the S104, the loop counter i is incremented by one (S105).

If the loop counter i has not reached the set number (S106: No), the S104 is executed again. If the loop counter i reaches the set number (S106: Yes), the third block 130 specifies the bit indicated by the boundary information of the head bit (S107). The bit indicated by the boundary information of the head bit is referred to as a bit A.

The third block 130 outputs a bit string from the head bit to the bit one bit before the bit A as a divided bit string (S108).

The first block 110 then receives the concatenation of the remaining bit string, that is, the bit string after the bit A, and a new bit string succeeding the remaining bit string as the next target bit string in the register group 111 (S109). Thereafter, the S102 is executed.

As described above, according to the first embodiment, the dividing circuit 100 divides a bit string composed of a variable length symbol into a plurality of bit strings and outputs the divided bit strings. The plurality of decode circuits 200 can decode a plurality of second bit strings in parallel. The merging circuit 300 can merge output of the plurality of decode circuits 200. The dividing circuit 100 includes a first block 110, a second block 120, and a third block 130. The first block 110 acquires a target bit string being a part of the first bit string and executes first operation for each bit of the target bit string. The first operation calculates a head bit of a succeeding symbol when the head bit of one symbol is assumed to be a targeted bit and records the head bit as boundary information associated with the targeted bit. The second block 120 executes the second operation for each bit of the target bit string for a set number of times. The second operation overwrites boundary information (first boundary information) associated with a targeted bit with the second boundary information associated with a bit indicated by the first boundary information. The third block 130 outputs a bit string from the head bit of the target bit string to the bit one bit before the bit indicated by the boundary information associated with the head bit of the target bit string as a divided bit string.

In other words, according to the first embodiment, a desired symbol boundary can be specified by executing the first operation for all the bits in parallel with a time corresponding to one decode and then executing the second operation for all the bits for a set number of times. Therefore, the time required for one dividing operation can be significantly reduced as compared with the comparative example. Thus, the throughput of the decode device 15 can be improved as compared with the comparative example.

Second Embodiment

In the first embodiment, a remaining bit string is returned to the first block 110. In a second embodiment, when a remaining bit string is generated, the remaining bit string is held in the third block 130 and processed when the next divided bit string is outputted.

The dividing circuit according to the second embodiment is referred to as a dividing circuit 100a. The configuration other than the dividing circuit 100a is the same as that of the decode device 15 of the first embodiment.

Figure 7:
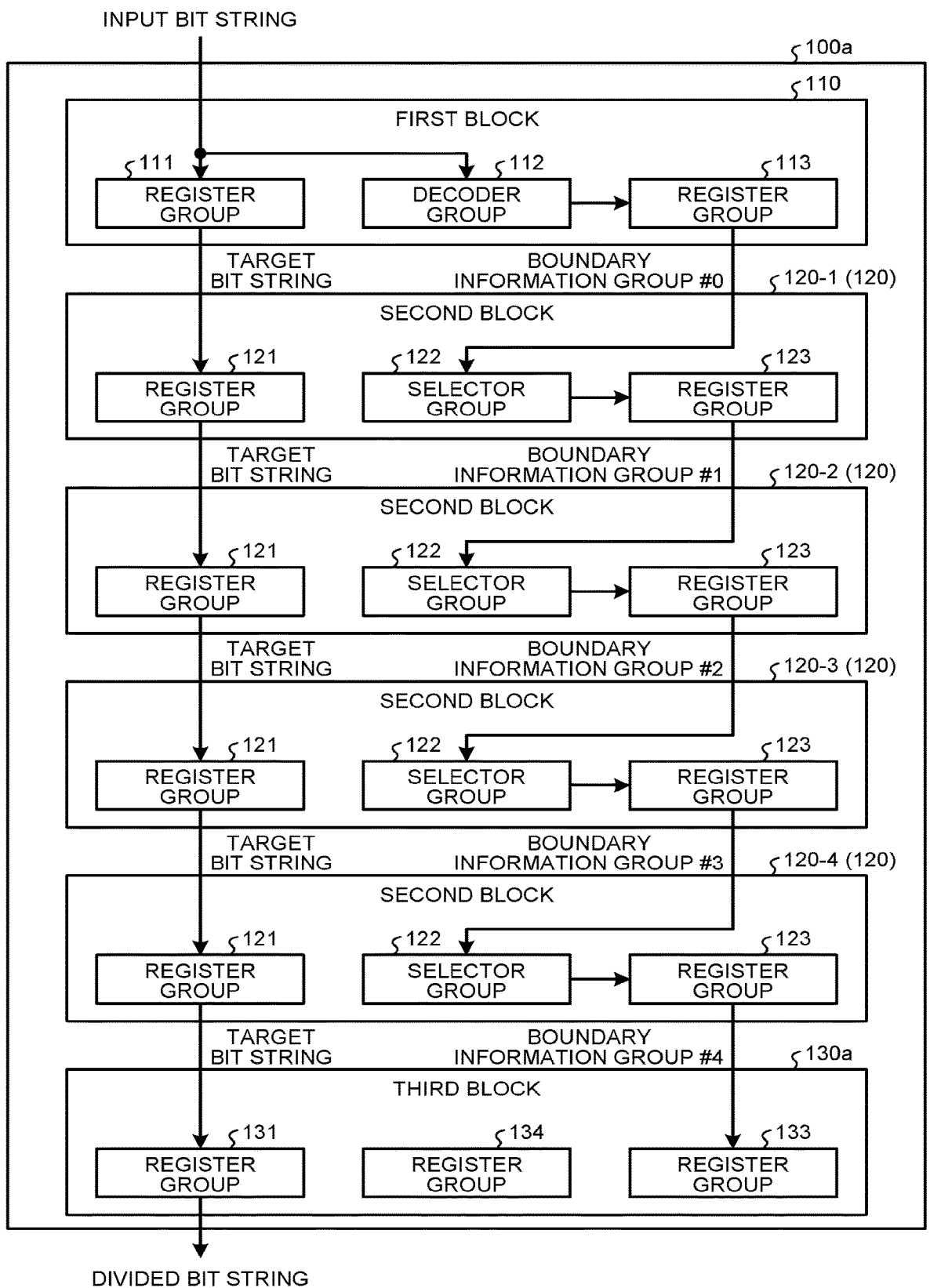
FIG. 7 is a schematic diagram illustrating an example of the configuration of a dividing circuit according to a second embodiment.

FIG. 7 is a schematic diagram illustrating an example of the configuration of the dividing circuit 100a according to the second embodiment. As illustrated in the figure, the dividing circuit 100a includes a first block 110, second blocks 120 having the number of blocks equal to the set number (in this example, four), and a third block 130a.

The configuration of the first block 110 is the same as that of the block with the identical name in the first embodiment. The configuration of each second block 120 is the same as that of the block with the identical name illustrated in FIG. 5 of the first embodiment.

The third block 130a includes a register group 131 for receiving the target bit string from the second block 120-4, a register group 133 for receiving the boundary information group #4 from the second block 120-4, and a register group 134 for storing the remaining bit string.

Figure 8:
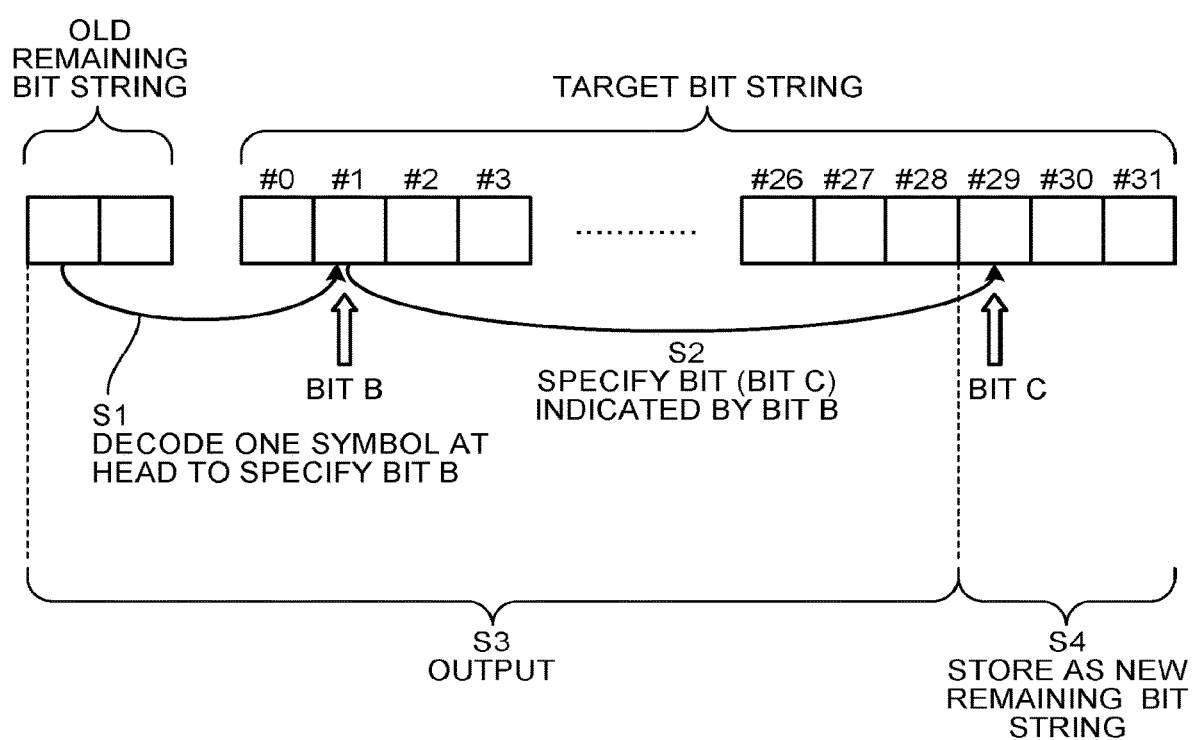
FIG. 8 is a schematic diagram for describing the operation of a third block according to the second embodiment.

FIG. 8 is a schematic diagram for describing the operation of the third block 130*a* according to the second embodiment.

In the third block 130*a*, when a remaining bit string is generated, the remaining bit string is stored in the register group 134. When the next target bit string is received in the register group 131, the third block 130 concatenates the old remaining bit string stored in the register group 134 to a front of the target bit string. A target bit string to which an old remaining bit string is concatenated is referred to as a concatenated bit string.

A head bit of a remaining bit string, that is, a head bit of a concatenated bit string, is set as a correct symbol boundary. The third block 130*a* then decodes one symbol at the head of the concatenated bit string to specify the head bit (referred to as a bit B) of the succeeding symbol (S1). In the previous dividing operation, since the second operation is executed until the boundary information group becomes a steady state, the length of the remaining bit string is less than one symbol. Therefore, the bit B is included in the target bit string.

Since the head bit of the concatenated bit string is a correct symbol boundary, the bit B specified in the above procedure is also guaranteed to be a correct symbol boundary. Therefore, the bit B is associated with boundary information indicating a symbol boundary positioned on the rearmost side among a plurality of symbol boundaries included in the target bit string.

The third block 130*a* specifies a bit (referred to as a bit C) indicated by the boundary information of the bit B (S2), and outputs a bit string from the head bit of the concatenated bit string to the bit one bit before the bit C as a divided bit string (S3). The third block 130*a* then stores the bit string after the bit C as a new remaining bit string in the register group 134 (S4).

Thus, according to the second embodiment, the remaining bit string is processed in the third block 130*a*. In other words, the dividing circuit 100*a* is configured so that there is no information including the remaining bit string, which is returned from each block to the block on the upstream side.

Therefore, the first block 110, the four second blocks 120, and the third block 130*a* in FIG. 7 can be operated as a pipeline structure. Operating the first block 110, the four second blocks 120, and the third block 130*a* as a pipeline structure enables a new target bit string in each cycle to be received, so that the throughput can be further improved.

Figure 9:
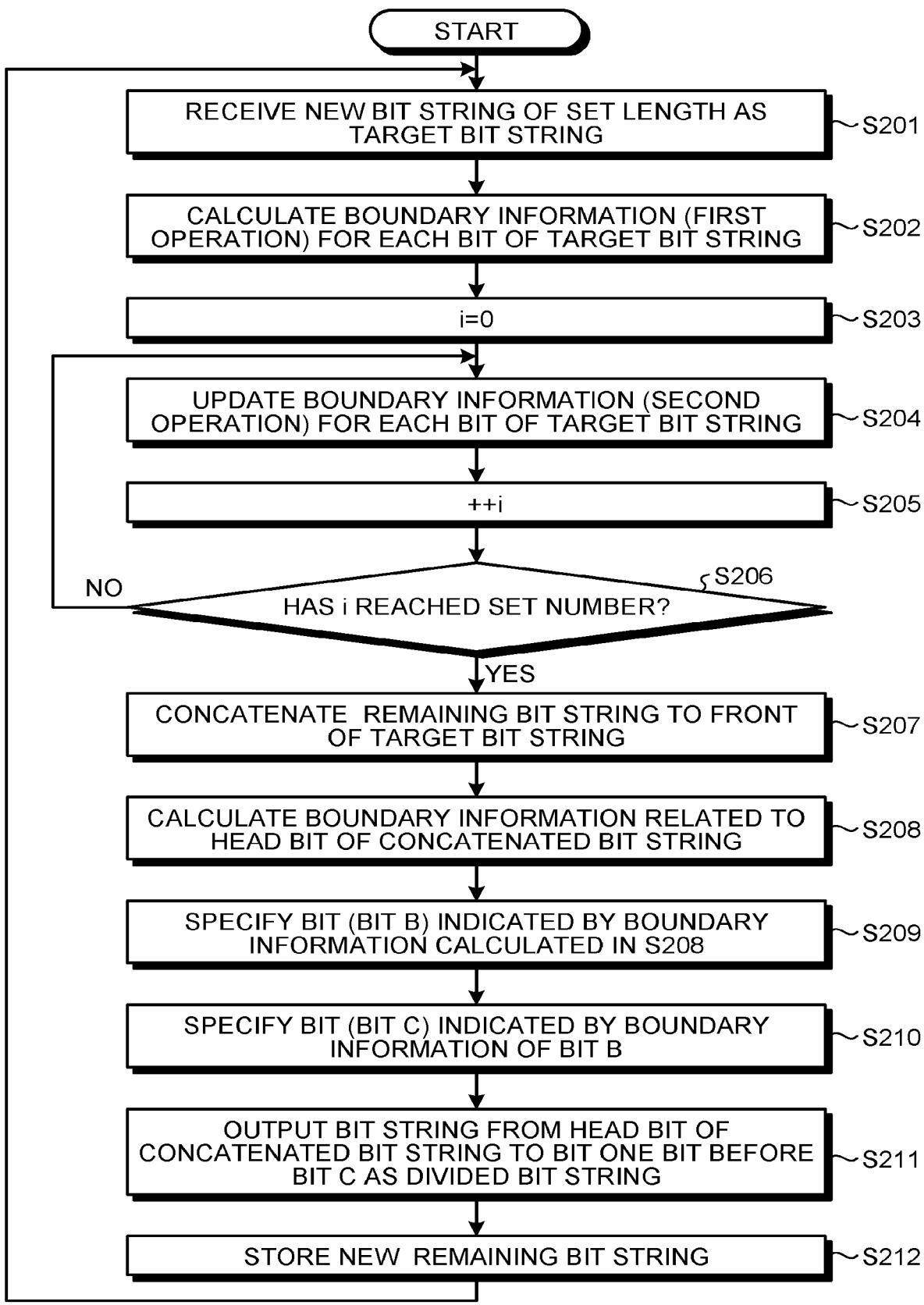
FIG. 9 is a flowchart for describing an example of the operation of the dividing circuit according to the second embodiment.

FIG. 9 is a flowchart for describing an example of the operation of the dividing circuit 100*a* according to the second embodiment.

In S201 to S206, the same operation as in the S101 to S106 in FIG. 6 is executed. In FIG. 9, the loop counter i is also used for convenience, but in the configuration illustrated in FIG. 7, the loop counter i is not provided in the dividing circuit 100*a*. Each of the second blocks 120 having the number of blocks equal to the set number executes the second operation for all the bits once, thereby realizing the second operation for the set number of times.

When the number of times of execution of the second operation for all the bits reaches the set number (S206: Yes), the third block 130*a* concatenates the remaining bit string to a front of the target bit string (S207).

The third block 130*a* then decodes one symbol at the head of the concatenated bit string to calculate boundary information related to the head bit of the concatenated bit string (S208). The third block 130*a* specifies a bit (i.e., a bit B) indicated by the boundary information calculated in the S208 (S209).

Further, the third block 130*a* specifies a bit (i.e., a bit C) indicated by the boundary information of the bit B (S210).

The third block 130*a* outputs a bit string from the head bit of the concatenated bit string to one bit before the bit C as a divided bit string (S211), and stores the bit string after the bit C as a new remaining bit string (S212).

The control then shifts to the S201.

In the description of FIG. 9, the case where there is no remaining bit string is not mentioned. The operation of the third block 130*a* in the case where there is no remaining bit string may be arbitrarily configured.

In one example, when there is no remaining bit string, the third block 130*a* may assume that there is a remaining bit string of 0-bit length and execute the S207 to S212.

In another example, when there is no remaining bit string, the third block 130*a* may specify the head bit of the target bit string as bit B and execute the S210 to S212.

Further, in the description of FIG. 9, the S201 to S212 is described as a loop operation for convenience. In practice, the S201 to S212 may be executed in a pipelined manner. In other words, for example, the first block 110 can receive the next target bit string regardless of the operation by the subsequent block after completing the S201 and S202 for a certain target bit string. Each of the second blocks 120 can execute the S204 for the next target bit string after completing the S204 for a certain target bit string. The third block 130*a* can execute the S207 to S212 for the next target bit string after completing the S207 to S212 for a certain target bit string.

As described above, according to the second embodiment, after acquiring one target bit string (i.e., the previous target bit string), the first block 110 acquires a new target bit string succeeding the one target bit string, and executes the first operation for each bit of the new target bit string. The second block 120 executes the second operation for each bit of the new target bit string for a set number of times. The third block 130*a* calculates a head bit (i.e., a bit B) of a succeeding symbol when the head bit of a concatenated bit string obtained by concatenating a remaining bit string in the previous target bit string to a front of a new target bit string is assumed as one symbol. The third block 130*a* then outputs a bit string from the head bit of the concatenated bit string to the bit one bit before the bit (i.e., a bit C) indicated by the boundary information of the bit B as a divided bit string.

In other words, according to the second embodiment, the dividing circuit 100*a* is configured so that there is no information including the remaining bit string, which is returned from each block to the block on the upstream side. Therefore, the first block 110, the plurality of second blocks 120, and the third block 130*a* can be operated as a pipeline structure. Operating the first block 110, the plurality of second blocks 120, and the third block 130*a* as a pipeline structure enables a new target bit string in each cycle to be received, so that the throughput can be further improved.

Third Embodiment

The dividing circuit according to a third embodiment is referred to as a dividing circuit 100*b*. The configuration other than the dividing circuit 100*b* is the same as that of the decode device 15 of the first embodiment.

Figure 10:
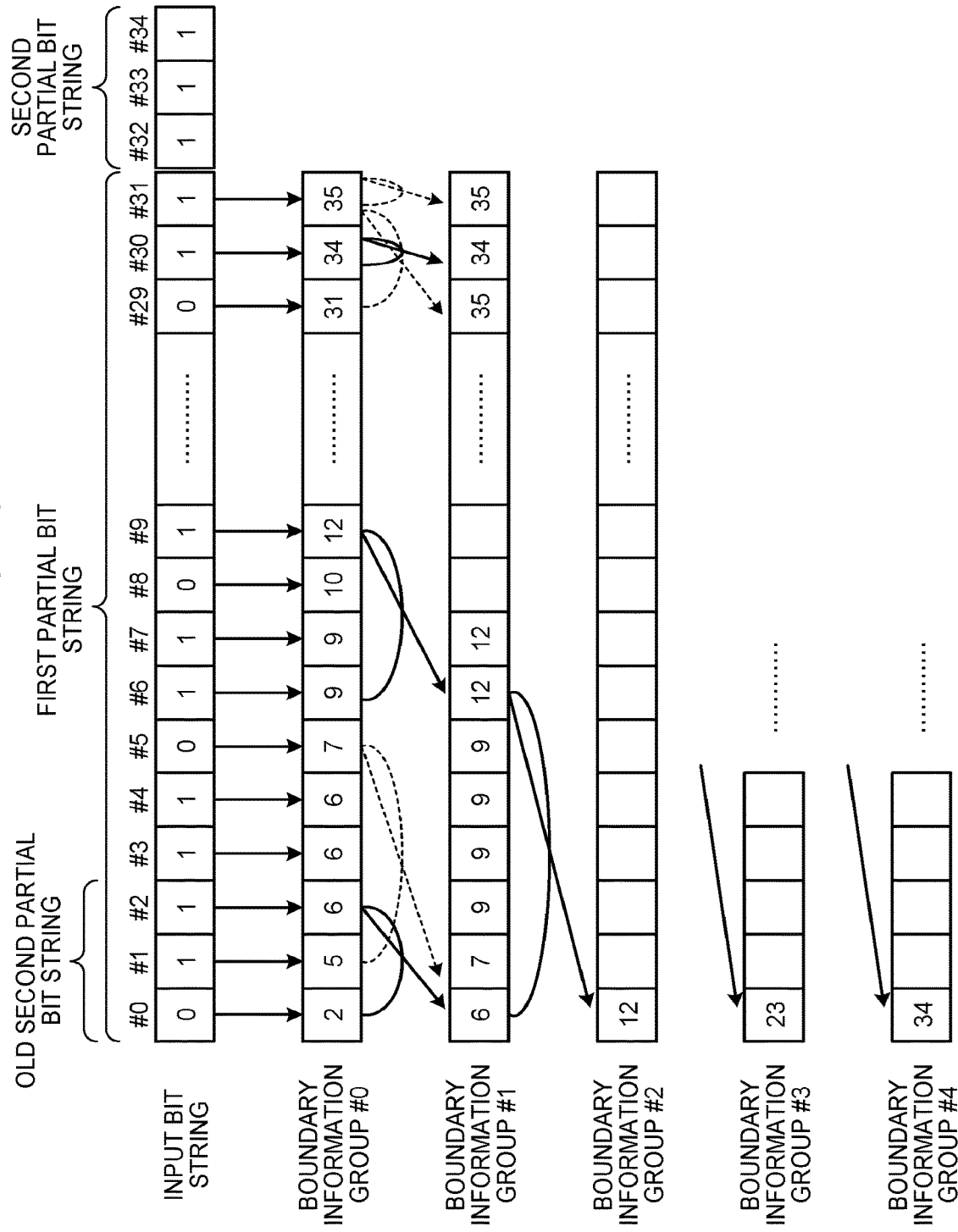
FIG. 10 is a schematic diagram for describing the operation of a dividing circuit according to a third embodiment.
Figure 11:
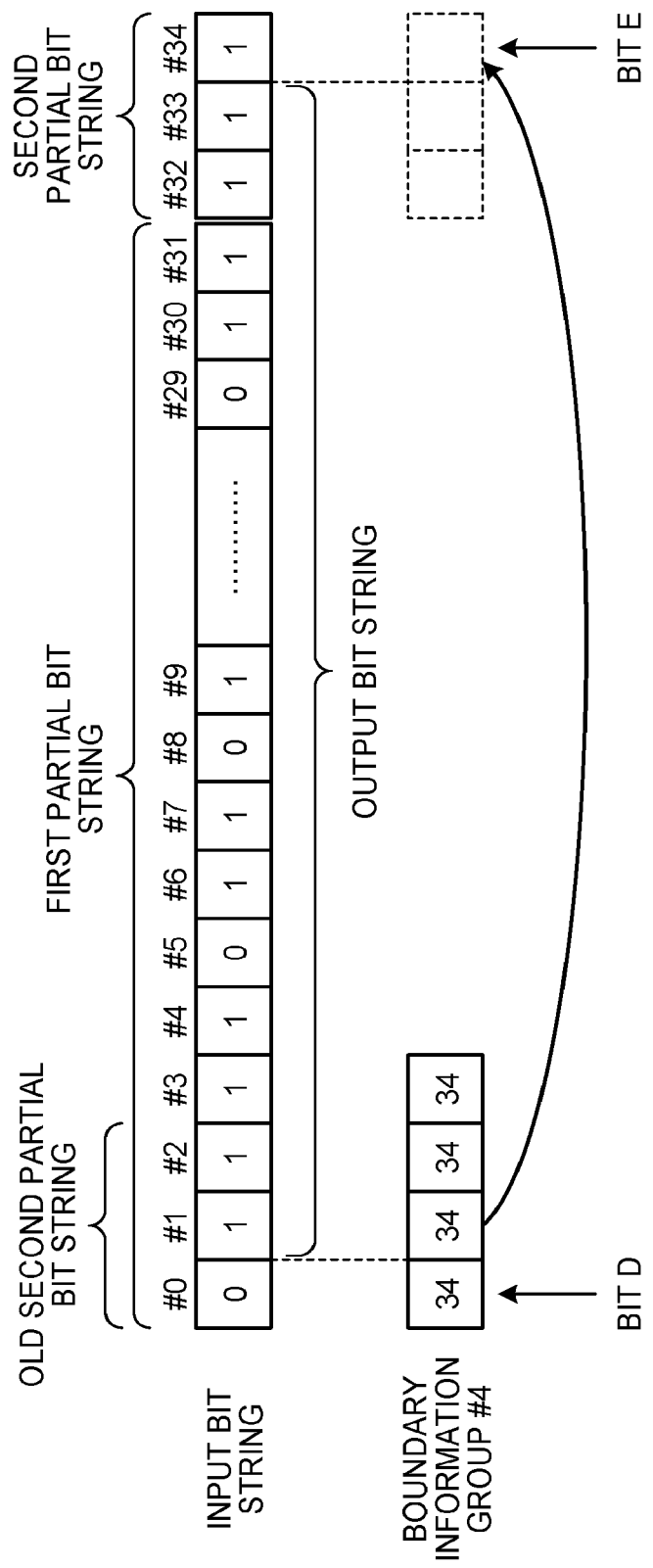
FIG. 11 is a schematic diagram for describing the operation of the dividing circuit according to the third embodiment.

FIGS. 10 and 11 are schematic diagrams for describing the operation of the dividing circuit 100*b* according to the third embodiment.

According to the third embodiment, in each dividing operation, a bit string partially overlapping with a bit string inputted for the previous dividing operation is inputted to the first block (first block 110b in FIG. 12) as a target bit string.

As illustrated in FIG. 10, the target bit string is composed of a first partial bit string and a second partial bit string succeeding the first partial bit string. The second partial bit string is inputted so as to overlap the head part of the first partial bit string in the next dividing operation. Therefore, the first partial bit string includes, in the head part, a bit string (old second partial bit string) inputted as the second partial bit string in the previous dividing operation.

The second partial bit string has a length that is one bit shorter than the maximum symbol length and, in this example, has a length of three bits. Three bits from a bit #32 to a bit #34 of the target bit string correspond to the second partial bit string. Three bits from the bit #0 to the bit #2 of the target bit string also correspond to the old second partial bit string.

As illustrated in FIG. 10, the first operation is performed for each bit of the first partial bit string. The second operation is also performed for each bit of the first partial bit string.

When the boundary information group is in a steady state, the boundary information of all the bits of the first partial bit string becomes a state indicating any of the bits included in the second partial bit string. In other words, in the third embodiment, the division is performed at the head of the second partial bit string or the middle of the second partial bit string.

Figure 12:
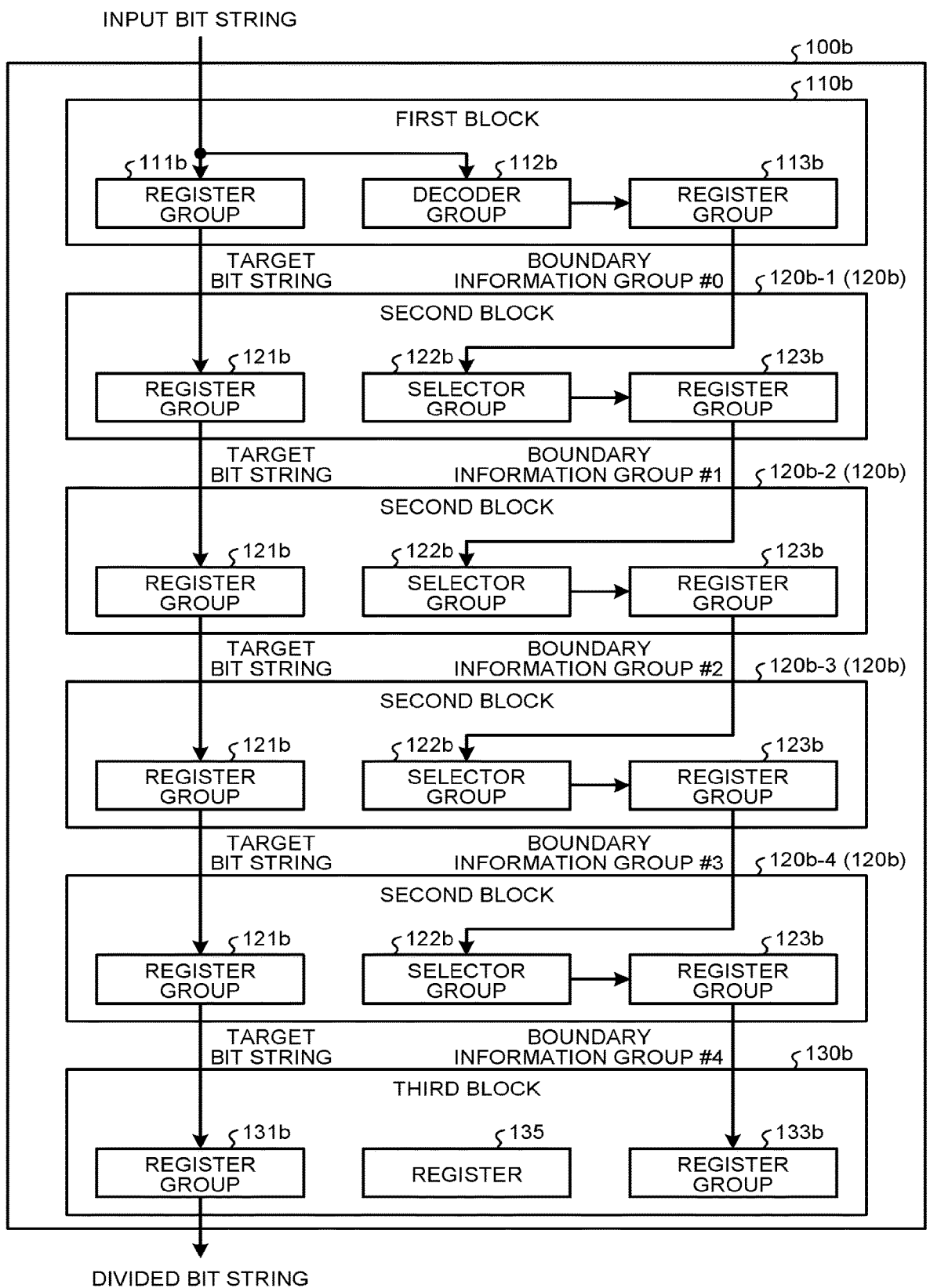
FIG. 12 is a schematic diagram illustrating an example of the configuration of the dividing circuit according to the third embodiment.

The positions divided in the previous dividing operation are stored in the third block (third block 130b in FIG. 12). According to the example illustrated in FIG. 11, the third block 130b stores the second bit of the old second partial bit string as a bit (referred to as a bit D) corresponding to the division position. In other words, in the previous dividing operation, the division is performed immediately before the bit D. The division position means that the bit D corresponds to a correct symbol boundary.

Since the bit D is a correct symbol boundary, in a steady state, the bit D should be associated with boundary information indicating a symbol boundary positioned on the rearmost side among a plurality of symbol boundaries included in the target bit string. Therefore, the third block 130b specifies a bit (referred to as a bit E) indicated by the boundary information of the bit D. The third block 130b then outputs a bit string from the bit D to the bit one bit before the bit E as a divided bit string and stores the bit E as a new bit D.

FIG. 12 is a schematic diagram illustrating an example of the configuration of the dividing circuit 100b according to the third embodiment. As illustrated in the figure, the dividing circuit 100b includes a first block 110b, second blocks 120b-1, 120b-2, 120b-3, and 120b-4 having the number of blocks equal to the set number (in this example, four), and a third block 130b.

The first block 110b includes a register group 111b, a decoder group 112b, and a register group 113b. In each dividing operation, a bit string partially overlapping with a bit string inputted for the previous dividing operation is inputted to the register group 111b as a target bit string. The decoder group 112b executes first operation for each bit included in the first partial bit string. The decoder group 112b stores the boundary information group (i.e., boundary information group #1) obtained by the execution of the first operation in the register group 113b.

The four second blocks 120b-1, 120b-2, 120b-3, and 120b-4 are connected in series. Further, the four second blocks 120b-1, 120b-2, 120b-3, and 120b-4 also have identical configurations. The four second blocks 120b-1, 120b-2, 120b-3, and 120b-4 are collectively referred to as a second block 120b.

Each of the second blocks 120b includes a register group 121b, a selector group 122b, and a register group 123b. The register group 121b receives the target bit string from the preceding circuit block. The selector group 122b receives a boundary information group composed of boundary information for each bit of the first partial bit string from the preceding circuit block and executes second operation for each bit included in the first partial bit string. The selector group 122b then stores the execution result of the second operation in the register group 123b.

The third block 130b includes a register group 131b, a register group 133b, and a register 135. The register group 131b receives the target bit string from the preceding circuit block. The register group 133b receives a boundary information group (i.e., boundary information group #4) composed of boundary information for each bit of the first partial bit string from the preceding circuit block. The register 135 stores the bit D.

The third block 130b specifies the bit E based on boundary information of the bit D, and outputs a bit string from the bit D to the bit one bit before the bit E of the target bit string as a divided bit string. The third block 130b then stores the bit E as a new bit D in the register 135.

Figure 13:
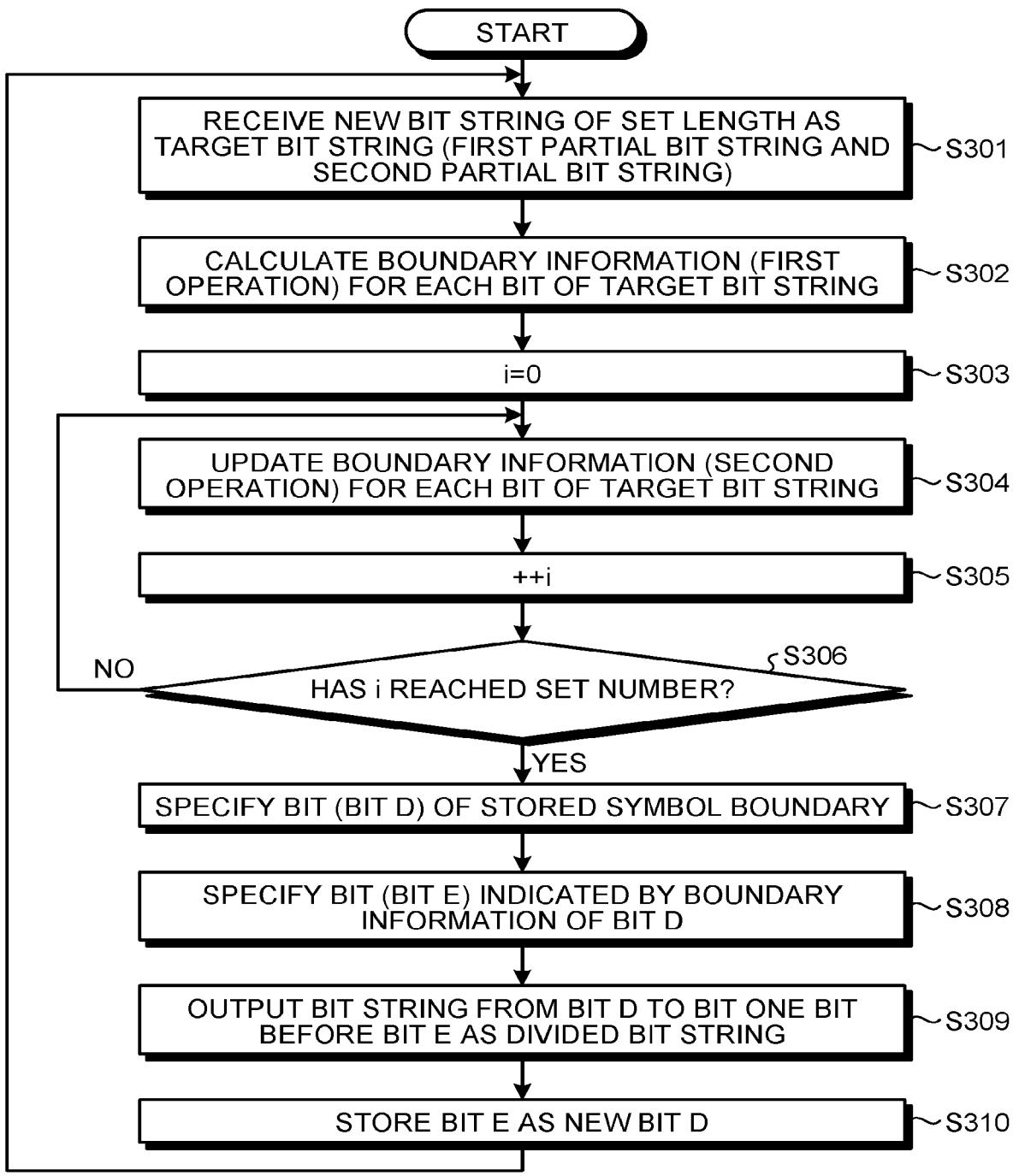
FIG. 13 is a flowchart for describing an example of the operation of the dividing circuit according to the third embodiment.

FIG. 13 is a flowchart for describing an example of the operation of the dividing circuit 100b according to the third embodiment. Although the loop counter i is also used for convenience in the description of the figure, the loop counter i is not actually provided in the dividing circuit 100b for the same reason as that described in the second embodiment.

The first block 110b first receives a new bit string of a set length as a target bit string in the register group 111b (S301). However, the target bit string is composed of a first partial bit string and a second partial bit string succeeding the first partial bit string.

The decoder group 112b of the first block 110 subsequently calculates boundary information (first operation) for each bit of the first partial bit string (S302).

The loop counter i is then reset to 0 (S303). The selector group 122b of the second block 120b updates boundary information (second operation) for each bit of the first partial bit string (S304). After the S304, the loop counter i is incremented by one (S305).

If the loop counter i has not reached the set number (S306: No), the S304 is executed again. If the loop counter i reaches the set number (S306: Yes), the third block 130b specifies the bit (i.e., a bit D) of the stored division position (S307). Further, the third block 130b specifies the bit (i.e., a bit E) indicated by the boundary information associated with the bit D (S308).

The third block 130b outputs a bit string from the bit D to the bit one bit before the bit E of the target bit string as a divided bit string (S309). The third block 130b then stores the bit E as a new bit D (S310).

The control then shifts to the S301.

In the figure, the S301 to S310 is also described as a loop operation for convenience. In practice, the S301 to S310 may be executed in a pipelined manner. In other words, for example, the first block 110b can receive the next target bit string regardless of the operation by the subsequent circuit block after completing the S301 and S302 for a certain target bit string. Each of the second blocks 120b can execute the S304 for the next target bit string after completing the S304 for a certain target bit string. The third block 130b can execute the S307 to S310 for the next target bit string after completing the S307 to S310 for a certain target bit string.

Thus, according to the third embodiment, the first block 110b receives, for each dividing operation, a target bit string obtained by concatenating a first partial bit string including the second partial bit string inputted in the previous dividing operation in the head part and a new second partial bit string succeeding the first partial bit string. The first block 110b then executes first operation for each bit of the first partial bit string. The second block 120b executes the second operation for each second partial bit string for the set number of times. The third block 130b then outputs a bit string from the bit stored as the bit D of the target bit string to the bit one bit before the bit (bit E) indicated by the bit D.

According to the third embodiment, as in the second embodiment, the first block 110b, the plurality of second blocks 120b, and the third block 130b can be operated as a pipeline structure. Operating the first block 110b, the plurality of second blocks 120b, and the third block 130b as a pipeline structure enables a new target bit string in each cycle to be received, so that the throughput can be further improved.

Fourth Embodiment

A fourth embodiment can be applied in combination with any of the first to third embodiments. As an example, a case where the fourth embodiment is used in combination with the second embodiment will be described.

The dividing circuit according to the fourth embodiment is referred to as a dividing circuit 100c. The configuration other than the dividing circuit 100c is the same as that of the decode device 15 of the first embodiment.

Figure 14:
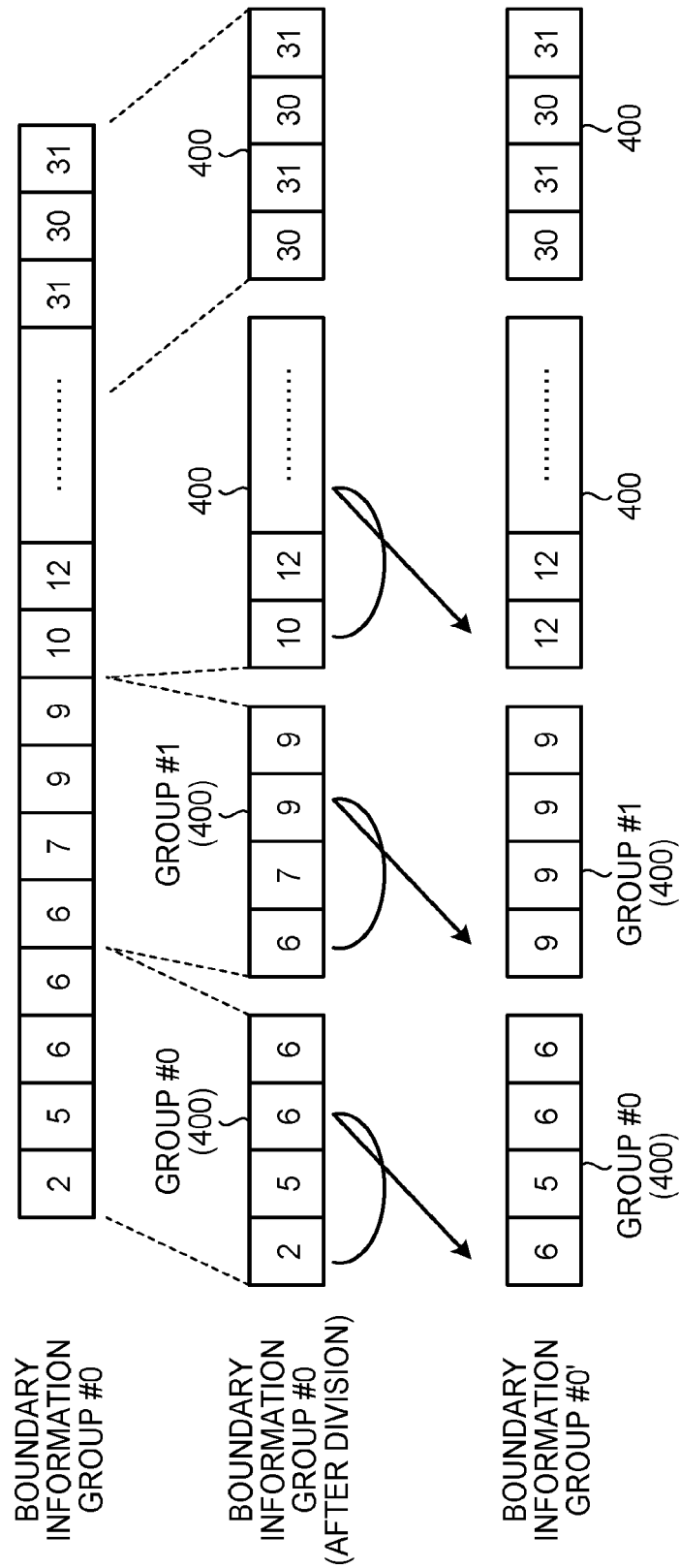
FIG. 14 is a schematic diagram for describing the operation of a dividing circuit according to a fourth embodiment.
Figure 15:
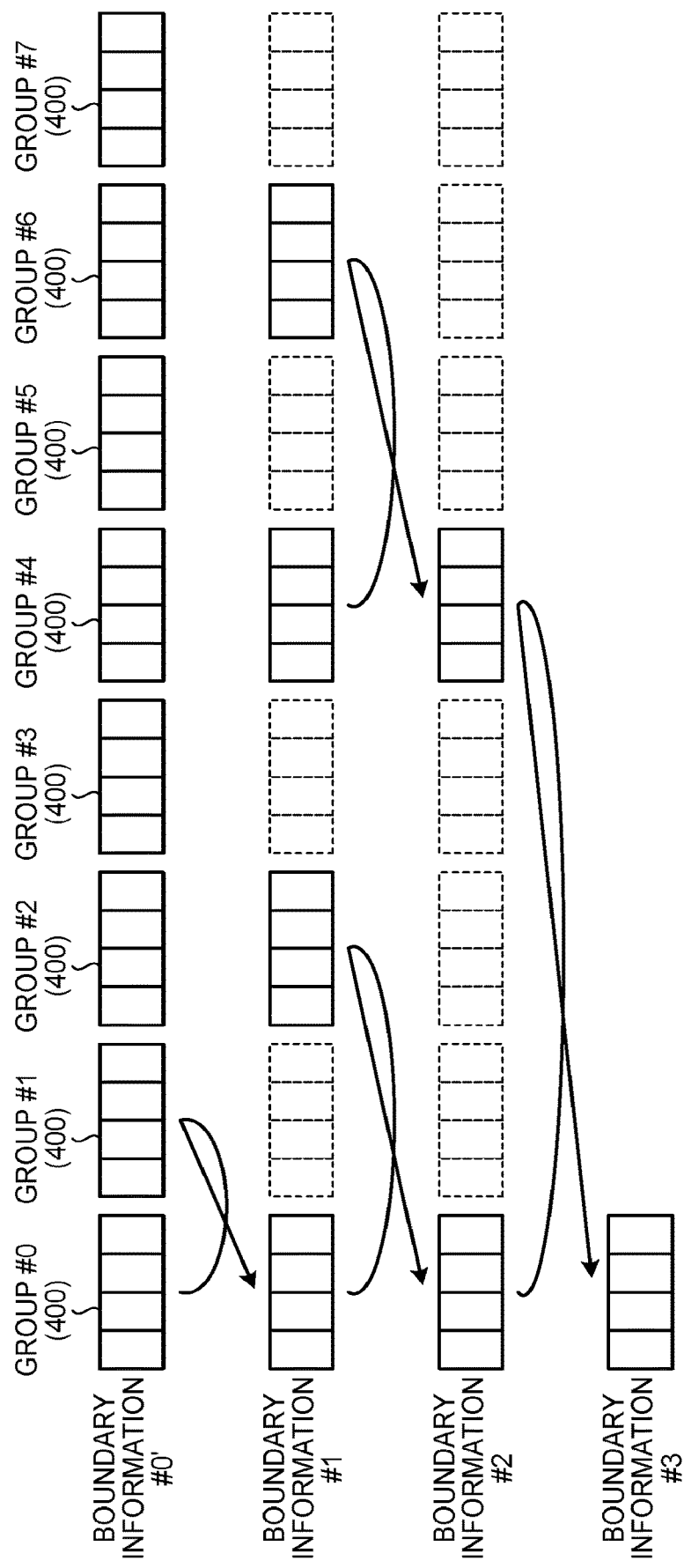
FIG. 15 is a schematic diagram for describing the operation of the dividing circuit according to the fourth embodiment.

FIGS. 14 and 15 are schematic diagrams for describing the operation of the dividing circuit 100c according to the fourth embodiment.

According to the fourth embodiment, the target bit string is divided into a plurality of groups 400 before the boundary information group #0 generated by the first block 110 is sent to the second block 120. The (p+1)th group 400 of the plurality of groups 400 is referred to as a group #p. Each of the plurality of groups 400 has a length equal to or longer than the maximum symbol length. The sizes of the plurality of groups 400 may or may not be unified.

According to the example of FIG. 14, the target bit string is divided into a plurality of groups 400 including groups such as a group #0 including four bits from a bit #0 to a bit #3, and a group #1 including four bits from a bit #4 to a bit #7.

After the group division, before the boundary information group is sent to the second block 120, third operation is further executed for each bit. The third operation overwrites third boundary information with boundary information (referred to as fourth boundary information) of a bit indicated by the third boundary information when the boundary information (referred to as third boundary information) of a targeted bit indicates the bit belonging to the same group 400 as the targeted bit. The third operation for all the bits is repeatedly executed until the boundary information of each bit indicates any bit of the adjacent group 400.

For example, the boundary information of the four bits included in the group #0 immediately after the division is "2", "5", "6", and "6". In other words, only the boundary information of the bit #0 indicates a bit (specifically, a bit #2) belonging to the same group #0 as the bit #0, and the boundary information of the other bits indicates a bit belonging to an adjacent group (specifically, group #1).

When the third operation for all the bits is executed once, the boundary information of the four bits included in the group #0 is updated to "6", "5", "6", and "6". Thus, all the boundary information of the four bits included in the group #0 is in a state indicating any bit belonging to the group #1. The boundary information group in the state where the third operation is completed is referred to as a boundary information group #0'.

When the third operation is completed, the second operation for each bit of the target bit string is executed for the set number of times.

Here, in the case of the second embodiment, since one symbol at the head of the concatenated bit string is decoded to specify the division position, a bit string having the length of the maximum symbol length of the head part of the target bit string is required. If the first embodiment is also used in combination, the boundary information of the head bit of the target bit string is required. If the third embodiment is also used in combination, as in the second embodiment, a bit string having the maximum symbol length of the head part of the target bit string is required. In other words, even if the fourth embodiment is used in combination with any of the first to third embodiments, only the boundary information group related to the group #0 can be finally required to specify the division position.

In this case, immediately before the second operation of the first time starts, the boundary information related to all the bits of each group 400 is in a state indicating any of the bits belonging to the adjacent group 400. Therefore, as illustrated in FIG. 15, in the second operation of the n-th time, the boundary information of the bits belonging to the group #x is overwritten by the boundary information of any bit belonging to the group #(x+2^(n−1)).

Therefore, in order to finally obtain only the boundary information group of the group #0, the register for holding the boundary information indicated by the dotted line in FIG. 15 and the selector for updating the boundary information stored in the register can be not required. Omitting these registers and selectors enables the circuit scale of the decode device 15 to be reduced.

Figure 16:
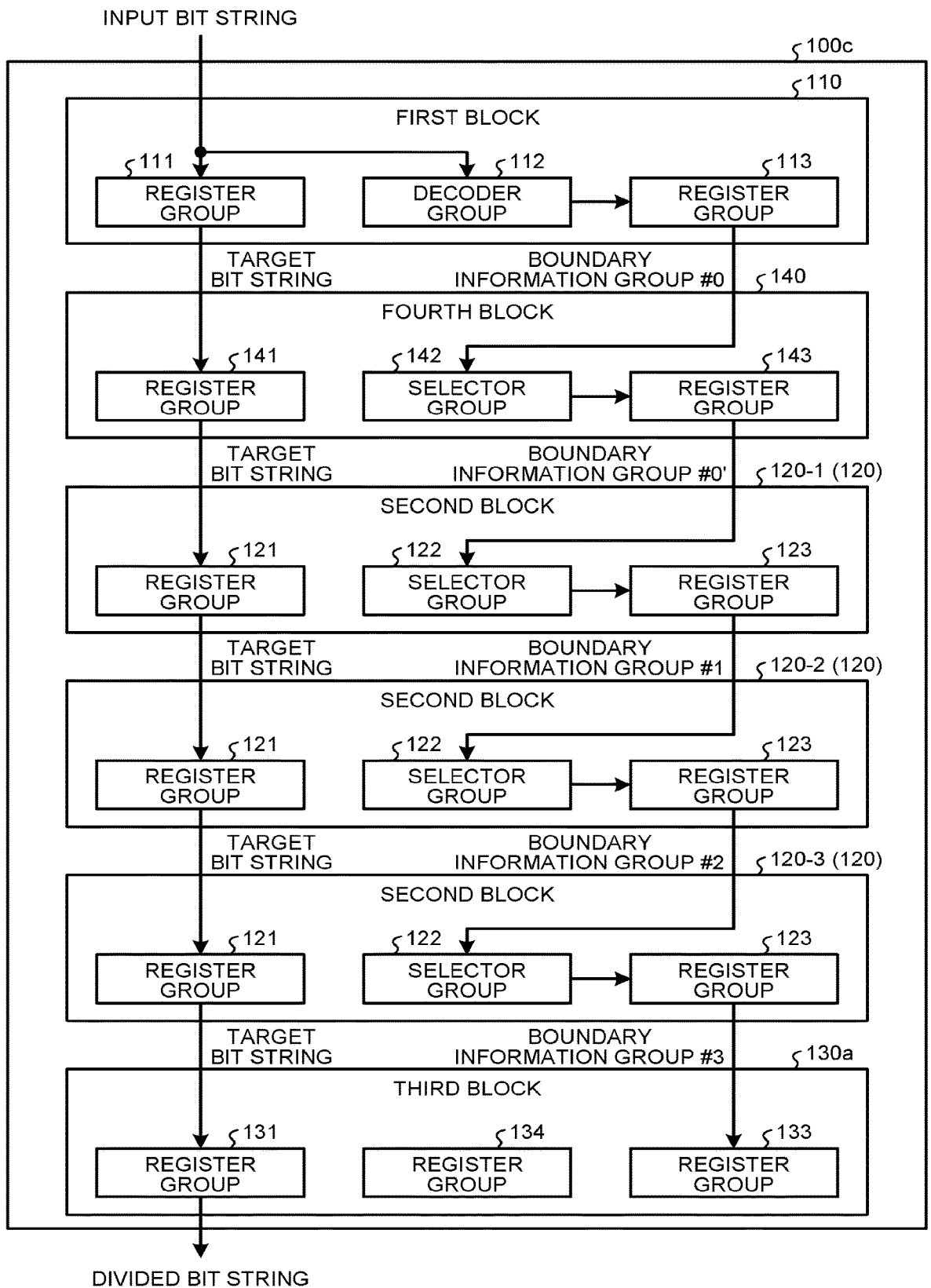
FIG. 16 is a schematic diagram illustrating an example of the configuration of the dividing circuit according to the fourth embodiment.

FIG. 16 is a schematic diagram illustrating an example of the configuration of the dividing circuit 100c according to the fourth embodiment. As illustrated in the figure, the dividing circuit 100c includes a first block 110, a fourth block 140, second blocks 120-1, 120-2, and 120-3 having the number of blocks (in this example, three) subtracted by only one from the set number, and a third block 130a.

The first block 110 has the same configuration as the circuit block with the identical reference name in the second embodiment.

The fourth block 140 includes a register group 141, a selector group 142, and a register group 143. The register group 141 receives the target bit string from the first block 110. The fourth block 140 divides the target bit string into a plurality of groups 400. The selector group 142 executes third operation for each bit after the division of the target bit string, and stores the obtained boundary information group #0' in the register group 143.

The three second blocks 120-1, 120-2, and 120-3 are connected in series. Further, the three second blocks 120-1, 120-2, and 120-3 have identical configurations. The three second blocks 120-1, 120-2, and 120-3 are collectively referred to as a second block 120.

Each of the second blocks 120 includes a register group 121, a selector group 122, and a register group 123. The register group 121 receives the target bit string from the preceding circuit block. The selector group 122 receives a boundary information group composed of boundary information for each bit of the target bit string from the preceding circuit block, and executes second operation for each bit included in the target bit string. The selector group 122 then stores the execution result of the second operation in the register group 123.

As described above, the register groups 123 of some of the second blocks 120 may be configured by omitting some of the registers from the register group 123 of the second embodiment. Further, the selector groups 122 of some of the second blocks 120 may be configured by omitting some of the selectors from the selector group 122 of the second embodiment.

For example, the second block 120-2 for executing the second operation of the second time allows a register for holding boundary information related to groups #1, #3, #5, and #7 in the register group 123 and a register for updating boundary information related to groups #1, #3, #5, and #7 in the selector group 122 to be omitted.

For example, registers for holding boundary information related to the groups #1, #2, #3, #5, #6, and #7 in the register group 123 and selectors for updating boundary information related to the groups #1, #2, #3, #5, #6, and #7 in the selector group 122 can be omitted from the second block 120-3 for executing the second operation of the third time.

The third block 130a includes a register group 131, a register group 133, and a register group 134. The register group 131 receives the target bit string from the preceding circuit block. The register group 133 receives a boundary information group #3 from the preceding circuit block. The register group 133 may be configured to receive only the boundary information group #3 related to the group #0. The register group 134 stores a remaining bit string.

Figure 17:
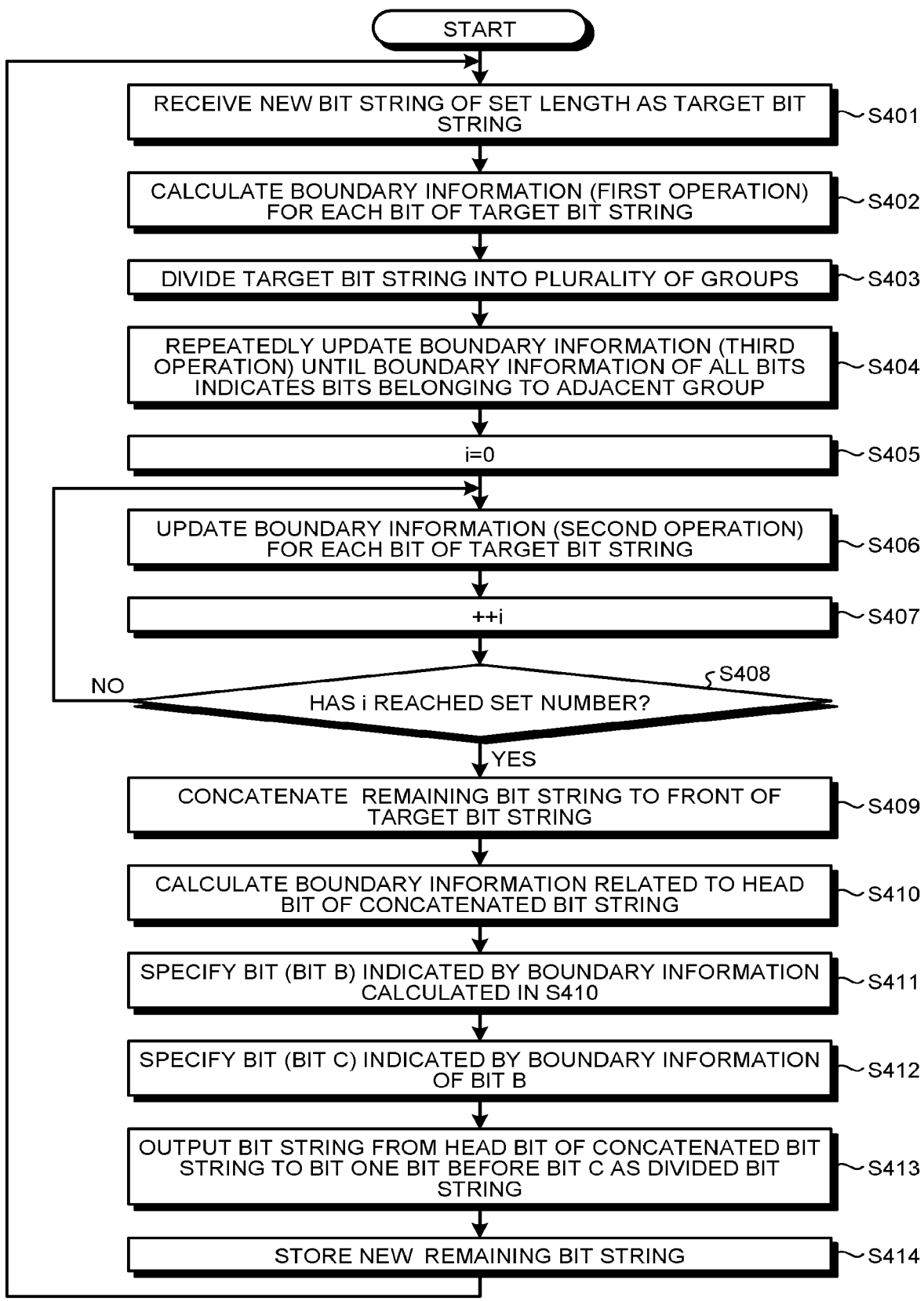
FIG. 17 is a flowchart for describing an example of the operation of the dividing circuit according to the fourth embodiment.

FIG. 17 is a flowchart for describing an example of the operation of the dividing circuit 100c according to the fourth embodiment. In the description of the figure, the loop counter i is used for convenience. However, for the same reason as the second embodiment, the loop counter i is not actually provided in the dividing circuit 100c.

In S401 and S402, the same operation as in the S201 and S202 is first executed. The fourth block 140 then divides the target bit string into a plurality of groups 400 (S403). The selector group 142 of the fourth block 140 repeatedly updates the boundary information (third operation) until the boundary information of all the bits indicates the bits belonging to the adjacent group (S404).

Thereafter, in S405 to S414, the same operation as in the S203 to S212 is executed, and the control shifts to the S401.

In the description of the figure, the S401 to S414 is also described as a loop operation for convenience. In practice, as in the second embodiment, the S401 to S414 may be executed in a pipelined manner.

As described above, according to the fourth embodiment, the dividing circuit 100c further includes the fourth block 140. The fourth block 140 divides the target bit string into a plurality of groups 400 each having the number of bits greater than or equal to the maximum symbol length, and executes third operation for each bit of the target bit string. The third operation overwrites third boundary information with boundary information (referred to as fourth boundary information) of a bit indicated by the third boundary information when the boundary information (referred to as third boundary information) of a targeted bit indicates the bit belonging to the same group 400 as the targeted bit.

Thus, as described with reference to FIG. 15, some of the registers and selectors can be omitted, so that the circuit scale of the decode device 15 can be reduced.

Fifth Embodiment

A fifth embodiment differs from the fourth embodiment in that the fourth block of the dividing circuit 100c executes additional operation.

Figure 18:
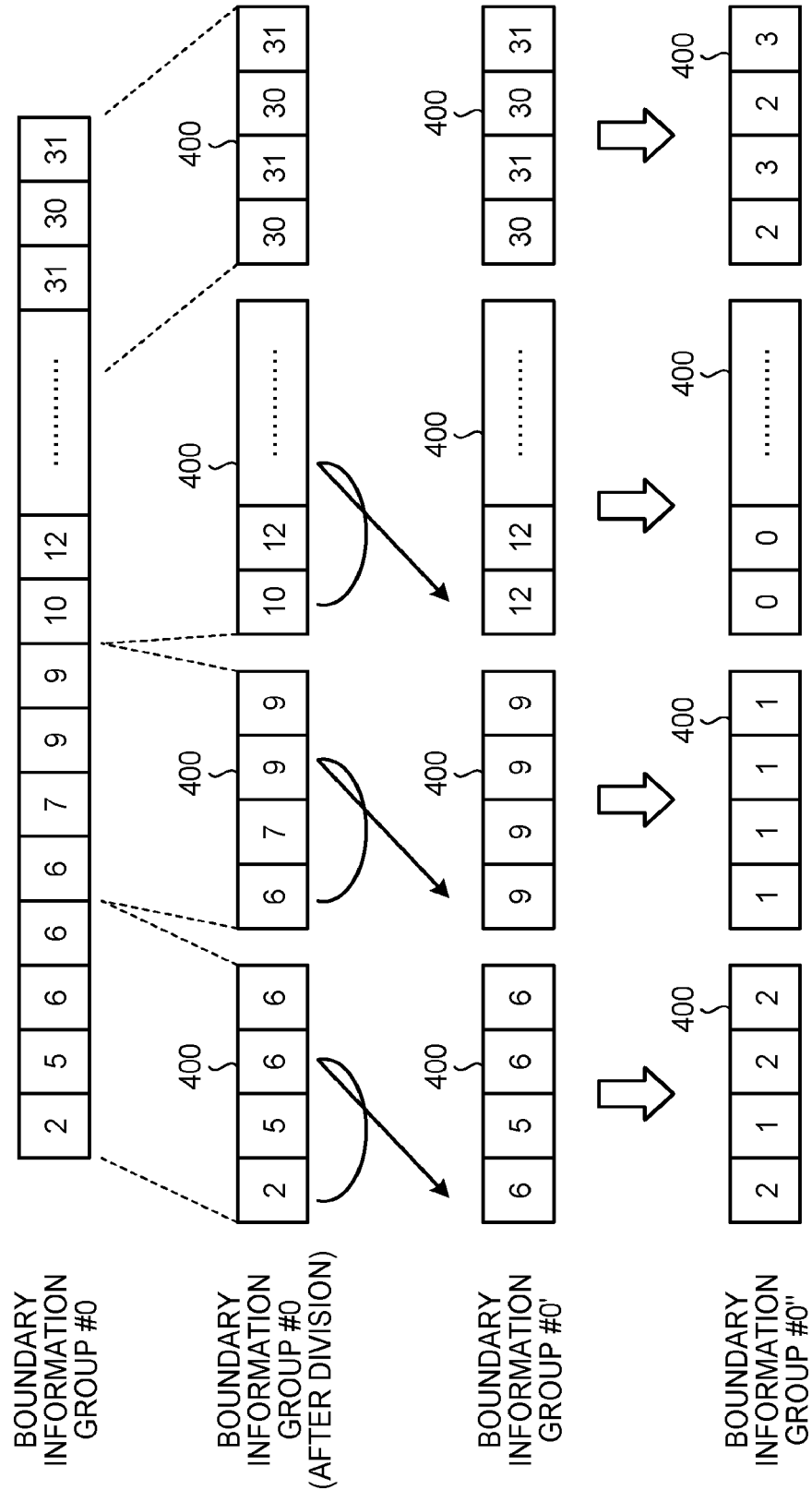
FIG. 18 is a schematic diagram for describing the operation of a fourth block according to a fifth embodiment.

FIG. 18 is a schematic diagram for describing the operation of the fourth block according to the fifth embodiment. As illustrated in the figure, according to the fifth embodiment, the fourth block 140 divides the target bit string into a plurality of groups and executes third operation, as in the fourth embodiment. When the boundary information group #0' is obtained as a result of the third operation, the fourth block 140 converts the value of each boundary information constituting the boundary information group #0' to a position relative to a head bit of the group 400.

Thus, converting each boundary information to a position relative to a head bit of the group 400 enables the number of bits of the register required for storing one piece of boundary information and the bit width of each selector constituting the selector group 122 to be reduced. Thus, the circuit scale of the decode device 15 can be further reduced.

The decode device 15 according to the first to fifth embodiments includes a plurality of decode circuits 200 and a merging circuit 300, in the subsequent stage of a plurality of dividing circuits 100, 100a, 100b, and 100c. Only one decode circuit is provided in the subsequent stage of the dividing circuits 100, 100a, 100b, and 100c, and a plurality of divided bit strings outputted from the dividing circuits 100, 100a, 100b, and 100c may all be decoded by the one decode circuit. In this case, the merging circuit 300 may be omitted. The one decode circuit corresponds to the first decode circuit.

In one example, the first decode circuit can decode the divided bit string sequentially from the head symbol.

In another example, the first decode circuit includes a decoder having multiple stages connected in series. Each decoder decodes one head symbol of an undecoded part of the bit string received from the preceding stage, and sends the bit string to the subsequent stage. Thus, the divided bit string is decoded sequentially from the head.

The decoder having multiple stages may be operated as a pipeline structure. Thus, the first decode circuit can receive the divided bit string in each cycle and output the decoded result of the divided bit string in each cycle.

As described above, according to the first to fifth embodiments, the dividing circuits 100, 100a, 100b, and 100c include the first blocks 110 and 110b for executing first operation for each bit of at least a part of the target bit string, the second blocks 120 and 120b for executing second operation for each bit of at least a part of the target bit string for a set number of times, and the third blocks 130, 130a, 130b, and 130c for outputting a bit string up to the bit one bit before the bit indicated by the boundary information of a set bit of the target bit string as a divided bit string.

Therefore, the time required for one dividing operation can be significantly reduced as compared with the comparative example. Thus, the throughput of the decode device 15 can be improved as compared with the comparative example.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A decode device comprising:
  a dividing circuit configured to divide a first bit string including variable length symbols into a plurality of second bit strings and to output the divided second bit strings; and
  a first decode circuit configured to decode the plurality of second bit strings, wherein
  the dividing circuit includes:
    a first block configured to execute first operation which includes
      acquiring a third bit string which is a part of the first bit string,
      calculating a head bit of a symbol succeeding one symbol by assuming one bit to be a head of the one symbol, and
      recording the head bit as boundary information associated with the one bit,
    the first block executing the first operation for each bit of at least a part of the third bit string;
    a second block configured to execute second operation which includes
      overwriting boundary information associated with one bit with boundary information associated with a bit indicated by the boundary information associated with the one bit,
    the second block executing the second operation for each bit of at least a part of the third bit string for a set number of times; and
    a third block configured to output a fourth bit string starting with a first bit of the third bit string and ending with one bit before a second bit indicated by boundary information associated with a first bit of the third bit string, as one of the plurality of second bit strings.

2. The decode device according to claim 1, wherein
  the first block is configured to execute the first operation for each bit of the third bit string,
  the second block is configured to execute the second operation for each bit of the third bit string for the set number of times, and
  the first bit is a head bit of the third bit string.

3. The decode device according to claim 1, wherein
  the first block is configured to execute the first operation for each bit of the third bit string,
  the second block is configured to execute the second operation for each bit of the third bit string for the set number of times,
  the first block is configured to acquire a fifth bit string succeeding the third bit string in the first bit string after acquiring the third bit string, and execute the first operation for each bit of the fifth bit string,
  the second block is configured to execute the second operation for each bit of the fifth bit string for the set number of times, and
  the third block is configured to
    generate a sixth bit string from the second bit to the end of the third bit string,
    generate a seventh bit string by concatenating a sixth bit string and the fifth bit string,
    calculate a third bit which is a head bit of a symbol succeeding one symbol when a head bit of the seventh bit string is assumed to be a head bit of the one symbol, and
    output an eighth bit string from the head bit of the seventh bit string to a bit one bit before a fourth bit indicated by boundary information associated with the third bit, as one of the plurality of second bit strings.

4. The decode device according to claim 1, wherein
  the third bit string is a concatenation of a fifth bit string and a sixth bit string succeeding the fifth bit string,
  the first block is configured to execute the first operation for each bit of the fifth bit string,
  the second block is configured to execute the second operation for each bit of the fifth bit string for the set number of times,
  the second bit is included in the sixth bit string,
  the first block is configured to acquire a seventh bit string in the first bit string after acquiring the third bit string,
  the seventh bit string is a concatenation of an eighth bit string and a ninth bit string,
  the eighth bit string succeeds the fifth bit string and includes the sixth bit string,
  the ninth bit string succeeds the eighth bit string,
  the first block executes the first operation for each bit of the eighth bit string,
  the second block is configured to execute the second operation for each bit of the eighth bit string for the set number of times,
  a third bit indicated by boundary information associated with the second bit is included in the ninth bit string, and
  the third block is configured to output a tenth bit string from the second bit to a bit one bit before the third bit in the seventh bit string, as one of the plurality of second bit strings.

5. The decode device according to claim 1, wherein
  the dividing circuit further includes a fourth block configured to execute third operation after the first operation and before second operation,
  the third operation includes:
    divide the third bit string into a plurality of groups each having a number of bits equal to or greater than a maximum symbol length, and
    overwrite boundary information of one bit with boundary information of a bit indicated by the boundary information of the one bit when the boundary information of the one bit indicates a bit belongs to a same group as the one bit.

6. The decode device according to claim 3, wherein
  the dividing circuit further includes a fourth block configured to execute third operation after the first operation and before second operation,
  the third operation includes:
    divide the third bit string into a plurality of groups each having a number of bits equal to or greater than a maximum symbol length, and
    overwrite boundary information of one bit with boundary information of a bit indicated by the boundary information of the one bit when the boundary information of the one bit indicates a bit belongs to a same group as the one bit.

7. The decode device according to claim 4, wherein
  the dividing circuit further includes a fourth block configured to execute third operation after the first operation and before second operation, the third operation includes:
    divide the third bit string into a plurality of groups each having a number of bits equal to or greater than a maximum symbol length, and
    overwrite boundary information of one bit with boundary information of a bit indicated by the boundary information of the one bit when the boundary information of the one bit indicates a bit belongs to a same group as the one bit.

8. The decode device according to claim 5, wherein the fourth block is configured to convert each boundary information to a position relative to a head bit of a succeeding group after the third operation.

9. The decode device according to claim 6, wherein the fourth block is configured to convert each boundary information to a position relative to a head bit of a succeeding group after the third operation.

10. The decode device according to claim 7, wherein the fourth block is configured to convert each boundary information to a position relative to a head bit of a succeeding group after the third operation.

11. The decode device according to claim 1, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

12. The decode device according to claim 2, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

13. The decode device according to claim 3, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

14. The decode device according to claim 4, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

15. The decode device according to claim 5, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

16. The decode device according to claim 6, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

17. The decode device according to claim 7, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

18. The decode device according to claim 8, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

19. The decode device according to claim 9, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

20. The decode device according to claim 10, further comprising:
    a merging circuit, wherein
    the first decode circuit includes a plurality of second decode circuits,
    each of the plurality of second decode circuits is configured to decode the plurality of second bit strings in parallel, and
    the merging circuit is configured to merge outputs of the plurality of second decode circuits.

* * * * *